(12) United States Patent
Kim et al.

(10) Patent No.: US 12,364,125 B2
(45) Date of Patent: Jul. 15, 2025

(54) DISPLAY PANEL HAVING INITIALIZATION LINES AND DISPLAY APPARATUS INCLUDING THE SAME

(71) Applicant: Samsung Display Co., Ltd., Yongin-Si (KR)

(72) Inventors: Kiwook Kim, Yongin-si (KR); Wonkyu Kwak, Yongin-si (KR); Kwangmin Kim, Yongin-si (KR); Yangwan Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/633,172

(22) Filed: Apr. 11, 2024

(65) Prior Publication Data

US 2024/0276811 A1    Aug. 15, 2024

Related U.S. Application Data

(63) Continuation of application No. 18/201,256, filed on May 24, 2023, now Pat. No. 11,985,875, which is a
(Continued)

(30) Foreign Application Priority Data

Jan. 6, 2022   (KR) .................. 10-2022-0002354

(51) Int. Cl.
*H01L 29/08*  (2006.01)
*H10K 59/121*  (2023.01)
(Continued)

(52) U.S. Cl.
CPC ....... *H10K 59/131* (2023.02); *H10K 59/1213* (2023.02); *H10K 59/1216* (2023.02); *H10K 59/353* (2023.02)

(58) Field of Classification Search
CPC ............... H10K 59/131; H10K 59/353; H10K 59/1213; H10K 59/1216
(Continued)

(56) References Cited

U.S. PATENT DOCUMENTS 11,580,906 B2    2/2023  Wang et al.
2011/0025671 A1  2/2011  Lee
(Continued)

FOREIGN PATENT DOCUMENTS

KR    10-2013-0083664 A    7/2013
KR    10-2016-0070653 A    6/2016
(Continued)

*Primary Examiner* — Phuc T Dang
(74) *Attorney, Agent, or Firm* — Innovation Counsel LLP

(57) ABSTRACT

A display panel is disclosed that includes a substrate, a first initialization voltage line, and a second initialization voltage line. The substrate includes a display area and a peripheral area. The first initialization voltage line is arranged in the display area and includes a first vertical voltage line and a first horizontal voltage line. The second initialization voltage line includes a second vertical voltage line and a second horizontal voltage line overlapping the first horizontal voltage line in a plan view. Each of the plurality of pixels includes a first sub-pixel configured to emit light of a first color, and a second sub-pixel configured to emit light of a second color. The first initialization voltage line is configured to transmit a first initialization voltage to one electrode of a light-emitting diode of the first sub-pixel. The second initialization voltage line is configured to transmit a second initialization voltage to one electrode of a light-emitting diode of the second sub-pixel.

5 Claims, 18 Drawing Sheets

Related U.S. Application Data continuation of application No. 17/868,070, filed on Jul. 19, 2022, now Pat. No. 11,665,943.

(51) Int. Cl.
   *H10K 59/131* (2023.01)
   *H10K 59/35* (2023.01)

(58) Field of Classification Search
   USPC .......................................................... 257/40
   See application file for complete search history.

(56) References Cited

U.S. PATENT DOCUMENTS

| | | |
|---|---|---|
| 2013/0181967 A1 | 7/2013 | Lee et al. |
| 2015/0294618 A1 | 10/2015 | Park et al. |
| 2019/0101785 A1* | 4/2019 | Araki ................. H10K 59/8723 |
| 2020/0066212 A1 | 2/2020 | Kim et al. |
| 2021/0183315 A1 | 6/2021 | Ka et al. |
| 2021/0193774 A1 | 6/2021 | Won et al. |
| 2021/0280127 A1 | 9/2021 | An et al. |
| 2021/0280130 A1 | 9/2021 | Wang et al. |
| 2021/0305349 A1 | 9/2021 | Kwon et al. |
| 2021/0376281 A1 | 12/2021 | Kim et al. |
| 2021/0391407 A1* | 12/2021 | Yoon ..................... G06F 3/0412 |

FOREIGN PATENT DOCUMENTS

| | | | |
|---|---|---|---|
| KR | 10-2019-0049995 A | 5/2019 | |
| KR | 10-2020-0023566 A | 3/2020 | |
| KR | 10-2021-0078648 A | 6/2021 | |
| KR | 10-2021-0111945 A | 9/2021 | |

* cited by examiner

DISPLAY PANEL HAVING INITIALIZATION LINES AND DISPLAY APPARATUS INCLUDING THE SAME

CROSS-REFERENCE TO RELATED APPLICATIONS

This application is a continuation application of U.S. patent application Ser. No. 18/201,256 filed on May 24, 2023 (now U.S. Pat. No. 11,985,875), which is a continuation of U.S. patent application Ser. No. 17/868,070, filed on Jul. 19, 2022 (now U.S. Pat. No. 11,665,943), which is based on and claims priority under 35 U.S.C. § 119 to Korean Patent Application No. 10-2022-0002354, filed on Jan. 6, 2022, in the Korean Intellectual Property Office, the entire disclosures of which are incorporated herein by reference.

BACKGROUND

1. Field

The present disclosure relates to a display panel and a display apparatus including the same, and more particularly, to a display panel including pixels that emit light of different colors, and a display apparatus including the display panel.

2. Description of the Related Art

Generally, an organic light-emitting display apparatus includes a plurality of pixels each including an organic light-emitting diode and a thin film transistor. The electrical characteristics of sub-pixels that emit light of different colors may vary according to a light-emitting layer that constitutes an organic light-emitting diode.

In display apparatuses according to the related art, the electrical characteristics of sub-pixels that emit light of different colors vary according to a light-emitting layer of the sub-pixels so that, when the same initialization voltage is applied to one electrode of each organic light-emitting diode, image quality characteristics may be lowered.

SUMMARY

One or more embodiments relate to a display pane in which electrical characteristics of an organic light-emitting diode may be compensated for according to the sub-pixels that emit light of different colors so that image quality characteristics are enhanced, and a display apparatus including the display panel. However, the scope of the present disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate including a display area in which a plurality of pixels are arranged, and a peripheral area surrounding at least a portion of the display area, a first initialization voltage line arranged in the display area and including a first vertical voltage line and a first horizontal voltage line, and a second initialization voltage line including a second vertical voltage line and a second horizontal voltage line overlapping the first horizontal voltage line in a plan view, wherein each of the plurality of pixels includes a first sub-pixel configured to emit light of a first color, and a second sub-pixel configured to emit light of a second color, the first initialization voltage line is configured to transmit a first initialization voltage to one electrode of a light-emitting diode of the first sub-pixel, and the second initialization voltage line is configured to transmit a second initialization voltage to one electrode of a light-emitting diode of the second sub-pixel.

Each of the plurality of pixels may further include a third sub-pixel configured to emit light of a third color, and the first initialization voltage line may be configured to transmit the first initialization voltage to one electrode of a light-emitting diode of the third sub-pixel.

Pixels arranged in a same row among the plurality of pixels may share the first horizontal voltage line and the second horizontal voltage line.

The first vertical voltage line and the second vertical voltage line may be spaced apart from each other with at least one pixel therebetween.

The display panel may further include a driving initialization voltage line arranged in the display area and extending in the first direction, and a common voltage line arranged in the display area, extending in the first direction and configured to transmit a common voltage to another electrode of the light-emitting diode, wherein each of the first sub-pixel and the second sub-pixel may include a driving transistor including a gate electrode, a first electrode connected to a node, and a second electrode connected to the light-emitting diode, and configured to transmit a driving current to the light-emitting diode, and a driving initialization transistor connected between the gate electrode of the driving transistor and the driving initialization voltage line and configured to transmit a driving initialization voltage applied from the driving initialization voltage line to the gate electrode of the driving transistor.

The driving initialization voltage line, the first vertical voltage line, the second vertical voltage line, and the common voltage line may be alternately arranged in the second direction with at least one pixel therebetween.

The driving initialization voltage line, the first vertical voltage line, the second vertical voltage line, and the common voltage line may be arranged on the same layer.

The first horizontal voltage line and the second horizontal voltage line may be arranged on different layers.

The display panel may further include a pixel circuit layer arranged between the substrate and the light-emitting diode and including a plurality of transistors and capacitors, wherein the pixel circuit layer a first semiconductor layer arranged on the substrate, a first conductive layer arranged on the first semiconductor layer, a second conductive layer arranged on the first conductive layer, a second semiconductor layer arranged on the second conductive layer, and a third conductive layer arranged on the second semiconductor layer, wherein the first horizontal voltage line may be arranged on the same layer as one of the first conductive layer, the second conductive layer, and the third conductive layer, and the second horizontal voltage line may be arranged on another layer among the first conductive layer, the second conductive layer, and the third conductive layer.

The first horizontal voltage line may be arranged on the same layer as the first conductive layer, and the second horizontal voltage line may be arranged on the same layer as the third conductive layer.

The pixel circuit layer may further include a fourth conductive layer arranged on the third conductive layer, and a fifth conductive layer arranged on the fourth conductive layer, and the first vertical voltage line and the second vertical voltage line may be arranged on the same layer as the fifth conductive layer, and a first connection wiring configured to electrically connect the first horizontal voltage line to the first sub-pixel and a second connection wiring configured to electrically connect the second horizontal voltage line to the second sub-pixel may be arranged on the fourth conductive layer.

The first initialization voltage and the second initialization voltage may be different from each other.

The display panel may further include a third initialization voltage line including a third vertical voltage line arranged in the display area and extending in the first direction, and a third horizontal voltage extending in the second direction and including a third horizontal voltage line overlapping the first horizontal voltage line and the second horizontal voltage line in a plan view, and each of the plurality of pixels may further include a third sub-pixel configured to emit light of a third color, and the third initialization voltage line may be configured to transmit a third initialization voltage to one electrode of a light-emitting diode of the third sub-pixel.

Pixels arranged in the same row among the plurality of pixels may share the first horizontal voltage line, the second horizontal voltage line, and the third horizontal voltage line.

The first vertical voltage line, the second vertical voltage line, and the third vertical voltage line may be spaced apart from each other with at least one pixel therebetween.

The display panel may further include a driving initialization voltage line arranged in the display area and extending in the first direction, and a common voltage line arranged in the display area, extending in the first direction and configured to transmit a common voltage to another one electrode of the light-emitting diode, wherein the driving initialization voltage line, the first vertical voltage line, the second vertical voltage line, the third vertical voltage line, and the common voltage line may be alternately arranged in the second direction with at least one pixel therebetween.

The display panel may further include a pixel circuit layer arranged between the substrate and the light-emitting diode and including a plurality of transistors and capacitors, wherein the pixel circuit layer may further include a first semiconductor layer arranged on the substrate, a first conductive layer arranged on the first semiconductor layer, a second conductive layer arranged on the first conductive layer, a second semiconductor layer arranged on the second conductive layer, and a third conductive layer arranged on the second semiconductor layer, and the first horizontal voltage line may be arranged on the same layer as the first conductive layer, the second horizontal voltage line may be arranged on the same layer as the second conductive layer, and the third horizontal voltage line may be arranged on the same layer as the third conductive layer.

An absolute value of a difference between the first initialization voltage and the third initialization voltage may be greater than an absolute value of a difference between the first initialization voltage and the second initialization voltage and an absolute value of a difference between the second initialization voltage and the third initialization voltage.

The pixel circuit layer may further include a fourth conductive layer arranged on the third conductive layer, and a fifth conductive layer arranged on the fourth conductive layer, and the first vertical voltage line, the second vertical voltage line, and the third vertical voltage line may be arranged on the same layer as the fifth conductive layer, and a first connection wiring configured to electrically connect the first horizontal voltage line to the first sub-pixel, a second connection wiring configured to electrically connect the second horizontal voltage line to the second sub-pixel, and a third connection wiring configured to electrically connect the third horizontal voltage line to the third sub-pixel may be arranged on the same layer as the fourth conductive layer.

The first initialization voltage, the second initialization voltage, and the third initialization voltage may be different from each other.

According to one or more embodiments, a display apparatus includes a display panel including a plurality of pixels, and a power supply circuit configured to apply a first initialization voltage and a second initialization voltage to the plurality of pixels, wherein the display panel may include a substrate including a display area in which a plurality of pixels are arranged, and a peripheral area surrounding at least a portion of the display area, a first initialization voltage line and a second initialization voltage line arranged in the display area, and each of the plurality of pixels may include a first sub-pixel configured to emit light of a first color, and a second sub-pixel configured to emit light of a second color, and the power supply circuit may be configured to supply the first initialization voltage to one electrode of a light-emitting diode of the first sub-pixel through the first initialization voltage line and to supply the second initialization voltage to one electrode of a light-emitting diode of the second sub-pixel through the second initialization voltage line.

A portion of the first initialization voltage line may overlap a portion of the second initialization voltage line in a plan view.

The first initialization voltage line may include a first vertical voltage line extending in a first direction and a first horizontal voltage line extending in a second direction intersecting the first direction, and the second initialization voltage line may include a second vertical voltage line extending in the first direction, and a second horizontal voltage line extending in the second direction and overlapping the first horizontal voltage line in a plan view.

Each of the plurality of pixels may further include a third sub-pixel configured to emit light of a third color, and the power supply circuit may be configured to transmit a first initialization voltage to one electrode of a light-emitting diode of the third sub-pixel through the first initialization voltage line.

According to one or more embodiments, a display apparatus includes a display panel including a plurality of pixels, and a power supply circuit configured to apply a first initialization voltage, a second initialization voltage, and a third initialization voltage to the plurality of pixels, wherein the display panel may include a substrate including a display area in which a plurality of pixels are arranged, and a peripheral area surrounding at least a portion of the display area, a first initialization voltage line, a second initialization voltage line and a third initialization voltage line, which are arranged in the display area, and each of the plurality of pixels may include a first sub-pixel configured to emit light of a first color, a second sub-pixel configured to emit light of a second color, and a third sub-pixel configured to emit light of a third color, and the power supply circuit may be further configured to supply the first initialization voltage to one electrode of a light-emitting diode of the first sub-pixel through the first initialization voltage line, to supply the second initialization voltage to one electrode of a light-emitting diode of the second sub-pixel through the second initialization voltage line, and to supply the third initialization voltage to one electrode of a light-emitting diode of the third sub-pixel through the third initialization voltage line.

In a plan view, a portion of the first initialization voltage line may overlap a portion of the second initialization voltage line and a portion of the third initialization voltage line.

The first initialization voltage line may include a first vertical voltage line extending in a first direction and a first horizontal voltage line extending in a second direction intersecting the first direction, and the second initialization voltage line may include a second vertical voltage line extending in the first direction and a second horizontal voltage line extending in the second direction and overlapping the first horizontal voltage line in a plan view, and the third initialization voltage line may further include a third vertical voltage line extending in the first direction and a third horizontal voltage line extending in the second direction and overlapping the first horizontal voltage line in a plan view.

Other aspects, features, and advantages than those described above will be clear from the following drawings, the claims, and the detailed description of the present disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
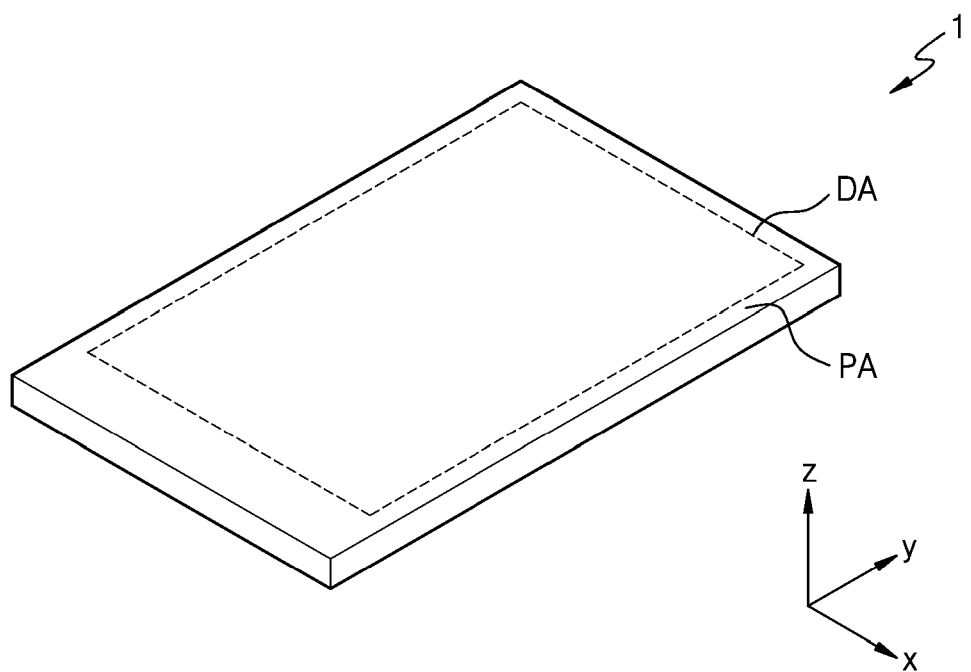
FIG. 1 is a perspective view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Since various transformations and various embodiments of the present disclosure are possible, specific embodiments are illustrated in the drawings and described in detail in the detailed description. Effects and features of the present disclosure, and a method of achieving them, will become apparent with reference to the embodiments described below in detail in conjunction with the drawings. However, the present disclosure is not limited to the embodiments to be disclosed below and may be implemented in various forms.

Hereinafter, embodiments of the present disclosure will be described in detail with reference to the accompanying drawings, and when described with reference to the drawings, the same or corresponding components are given the same reference numerals, and the overlapping description thereof will be omitted.

In the present specification, the terms of the first and second, etc. were used for the purpose of distinguishing one component from other components, not a limited sense.

In the present specification, the singular forms "a," "an," and "the" may indicate plural forms as well, unless the context clearly indicates otherwise.

In the present specification, the terms such as comprising, including, and having are meant to be the features described in the specification, or the components are present, and the possibility of one or more other features or components will be added, is not excluded in advance.

In the present specification, when a portion such as a layer, a region, a component or the like is on other portions, this is not only when the portion is on other components, but also when other components are interposed therebetween.

In the present specification, when a layer, a region, a component or the like is connected to other components, this is not only when a layer, a region, a component or the like is directly connected to each other or/and but also when a layer, a region, a component or the like is indirectly connected to each other while another layer, another region, another component or the like is interposed therebetween. For example, in the present specification, when a layer, a region, a component or the like is electrically connected to each other, this is not only when a layer, a region, a component or the like is directly electrically connected to each other or but also when a layer, a region and a component or the like is indirectly electrically connected to each other while another layer, another region, another component or the like is interposed therebetween.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

The meaning of a wiring "extends in a first direction or a second direction" in the present specification includes not only extending in a straight line form but also extending with a zigzag or curve in the first direction or the second direction.

When referred to as "in a plan view," it means when a target portion is viewed above, and when referred to as "in a cross-sectional view," it means when a cross-section in which the target portion is vertically cut, is viewed in a lateral direction.

In the present specification, a first component "overlapping" a second component means that the first component is positioned above or below the second component.

In the present specification, the x-axis, y-axis, and z-axis are not limited to three axes on an orthogonal coordinate system, and may be interpreted in a broad sense including this case. For example, the x-axis, the y-axis, and the z-axis may be orthogonal to each other, but may refer to different directions that are not necessarily at right angles to each other.

In the present specification, "ON" used in connection with a device state may refer to an activated state of a device, and "OFF" may refer to a deactivated state of the device. "ON" used in connection with a signal received by the device may refer to a signal for activating the device, and "OFF" may refer to a signal for deactivating the device. The device may be activated by a high-level voltage or a low-level voltage. For example, a P-channel transistor is activated by the low-level voltage, and an N-channel transistor is activated by the high-level voltage. Thus, it should be understood that "ON" voltage with respect to the P-channel transistor and the N-channel transistor is at an opposite (low vs high) voltage level.

In the drawings, for convenience of description, the sizes of components may be exaggerated or reduced. For example, since the size and thickness of each component shown in the drawings are arbitrarily indicated for convenience of description, the present disclosure is not necessarily limited to the illustration.

FIG. 1 is a perspective view schematically illustrating a display apparatus according to an embodiment.

A display apparatus according to embodiments may be implemented with an electronic apparatus, such as a smartphone, a mobile phone, a smart watch, a navigation device, a game machine, a television (TV), a car head unit, a notebook computer, a laptop computer, a personal media player (PMP), a personal digital assistants (PDA). Also, the electronic apparatus may be a flexible apparatus.

A display apparatus 1 may include a display area DA in which an image is displayed, and a peripheral area PA arranged to surround at least a portion of the display area DA. The display apparatus 1 may provide a certain image using light emitted from a plurality of pixels arranged in the display area DA.

The display apparatus 1 may be provided in various shapes, for example, a rectangular plate shape having two pairs of sides parallel to each other. When the display apparatus 1 is provided in a rectangular plate shape, sides of one of two pairs of sides may be longer than sides of the other one pair of sides. In an embodiment of the present disclosure, for convenience of explanation, the display apparatus 1 has a rectangular shape having a pair of long sides and a pair of short sides, and the extension direction of the short side is a first direction (x-direction), the extension direction of the long side is a second direction (y-direction), and a direction perpendicular to the extension direction of the long side and the extension direction of the short side is displayed as a third direction (z-direction). In another embodiment, the display apparatus 1 may have a non-rectangular shape. The non-rectangular shape may be, for example, a circular shape, a polygonal shape with a circular part, and a polygonal shape excluding a rectangular shape.

When the display area DA is viewed in a planar shape, the display area DA may be provided in a rectangular shape, as shown in FIG. 1. In another embodiment, the display area DA may have a polygonal shape such as a triangle, a pentagon, or a hexagon, a circular shape, an elliptical shape, an amorphous shape, or the like.

The peripheral area PA that is an area outside the display area DA may be a kind of non-display area in which no pixels are arranged. The display area DA may be entirely surrounded by the peripheral area PA. Various wirings for transmitting an electrical signal to be applied to the display area DA, and pads to which a printed circuit board (PCB) or a driver integrated circuit (IC) chip is attached, may be positioned in the peripheral area PA.

Hereinafter, an organic light-emitting display apparatus will be described as an example of a display apparatus according to an embodiment, however, the display apparatus according to the present disclosure is not limited thereto. In another embodiment, the display apparatus according to the present disclosure may be an inorganic light-emitting display or inorganic electroluminescent (EL) display apparatus or a quantum dot light-emitting display. For example, a light-emitting layer of a display device of the display apparatus may include an organic material or an inorganic material. Also, the display apparatus may include the light-emitting layer and quantum dots positioned on a path of light emitted from the light-emitting layer.

Figure 2:
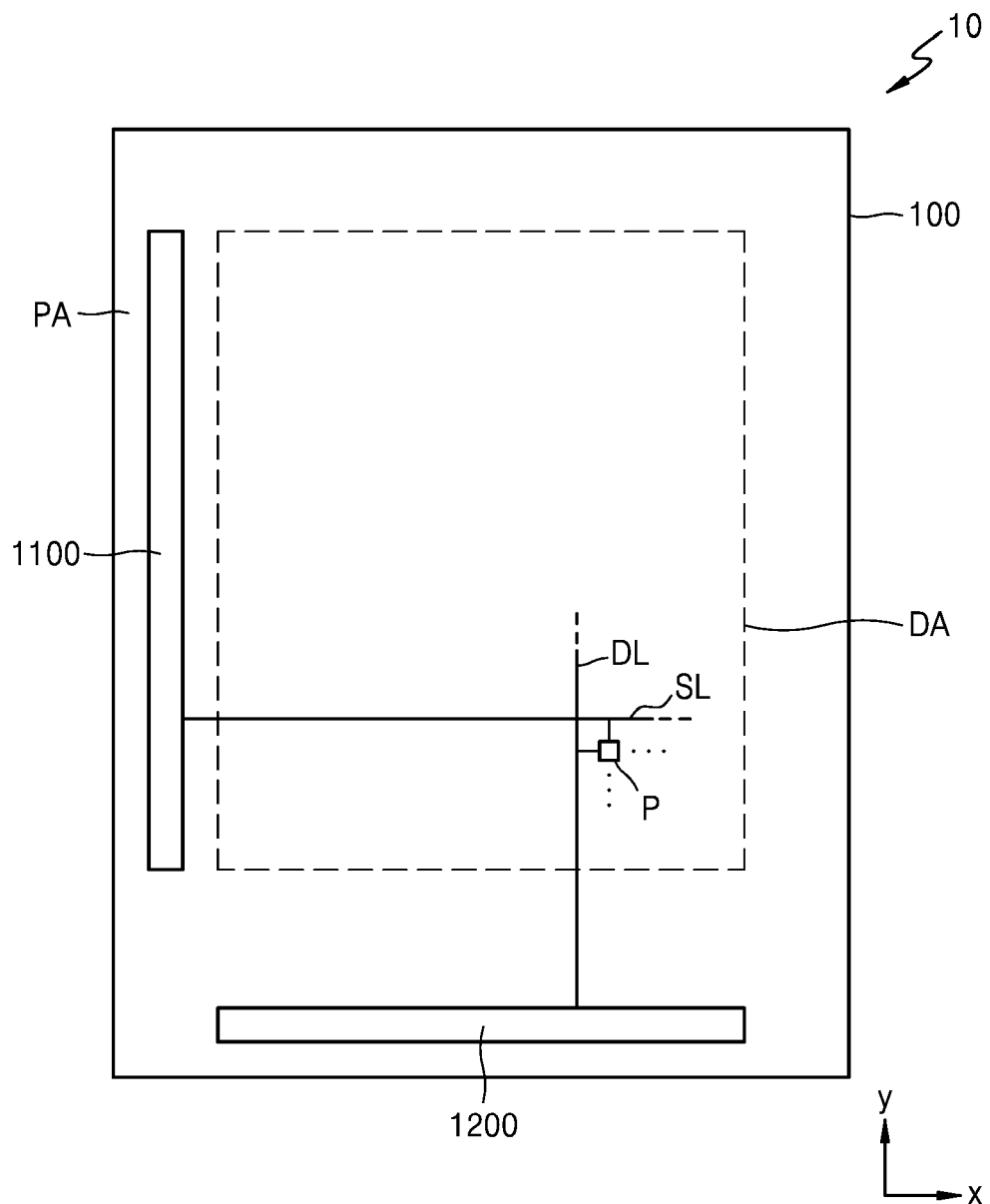
FIG. 2 is a plan view schematically illustrating a display panel according to an embodiment.

FIG. 2 is a plan view schematically illustrating a display panel according to an embodiment.

The display apparatus 1 may include a display panel 10 for displaying an image. FIG. 2 illustrates a substrate 100 of the display panel 10, and for example, the substrate 100 may have a display area DA and a peripheral area PA.

Referring to FIG. 2, the display panel 10 includes pixels P arranged in the display area DA. The pixels P may include a display element. The display element may be connected to a pixel circuit. The display element may include an organic light-emitting diode, a quantum dot organic light-emitting diode, or the like. Each of the pixels P may include at least one sub-pixel configured to emit light of red, green, blue or white, for example, through the display element.

A scan driver 1100 for providing a scan signal to the pixel circuit of each pixel P, a data driver 1200 for providing a data signal to the pixel circuit of each pixel P, and main power wirings (not shown) for providing a power supply voltage may be arranged in the peripheral area PA. In FIG. 2, the data driver 1200 is arranged adjacent to one side of the substrate 100. However, according to another embodiment, the data driver 1200 may be arranged on a flexible printed circuit board (FPCB) electrically connected to a pad arranged on one side of the display panel 10. A plurality of scan drivers 1100 may be provided.

An input sensing layer and an optical functional layer may be further provided on the display panel 10, and the display panel 10, the input sensing layer, and the optical functional layer may be covered by a window. The input sensing layer may acquire coordinate information according to an external input, for example, a touch event. The input sensing layer may sense the external input in a mutual cap manner or/and a self cap manner. The optical functional layer may include an antireflection layer, and the antireflection layer may include a retarder and a polarizer. In another embodiment, the antireflection layer may include a black matrix and color filters.

Figure 3:
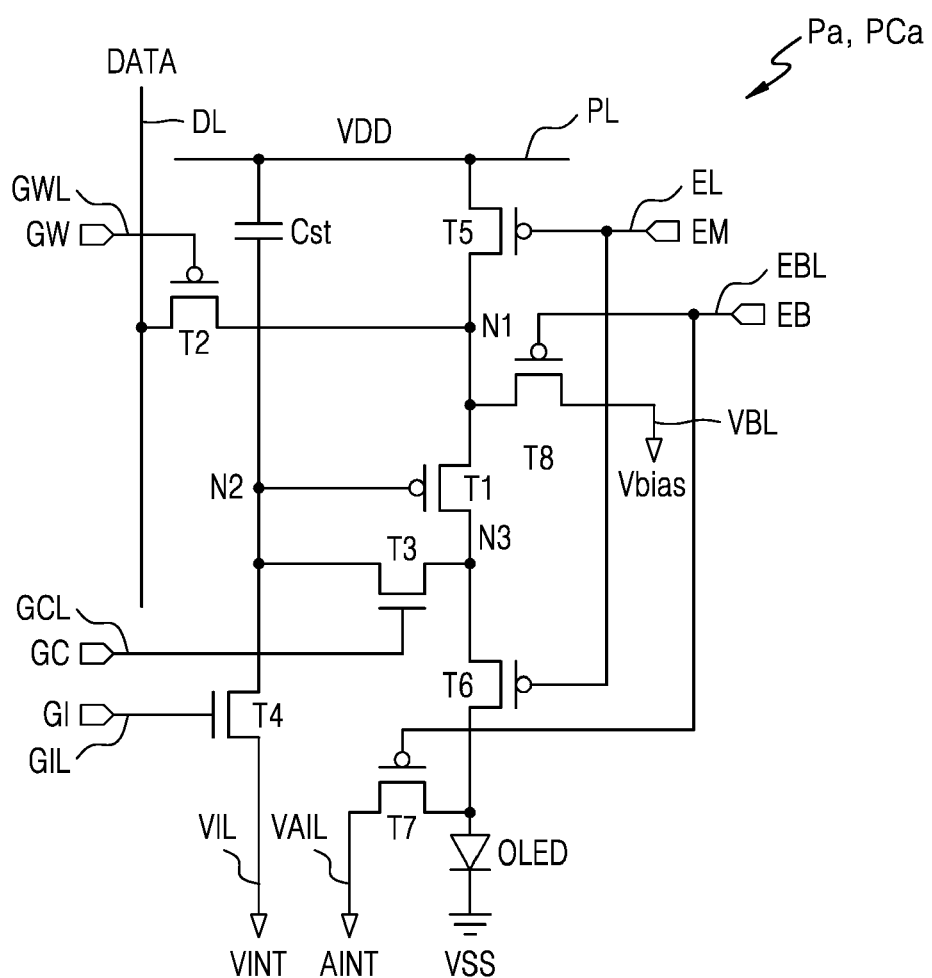
FIG. 3 is an equivalent circuit diagram of one sub-pixel of a display panel according to an embodiment.
Figure 4:
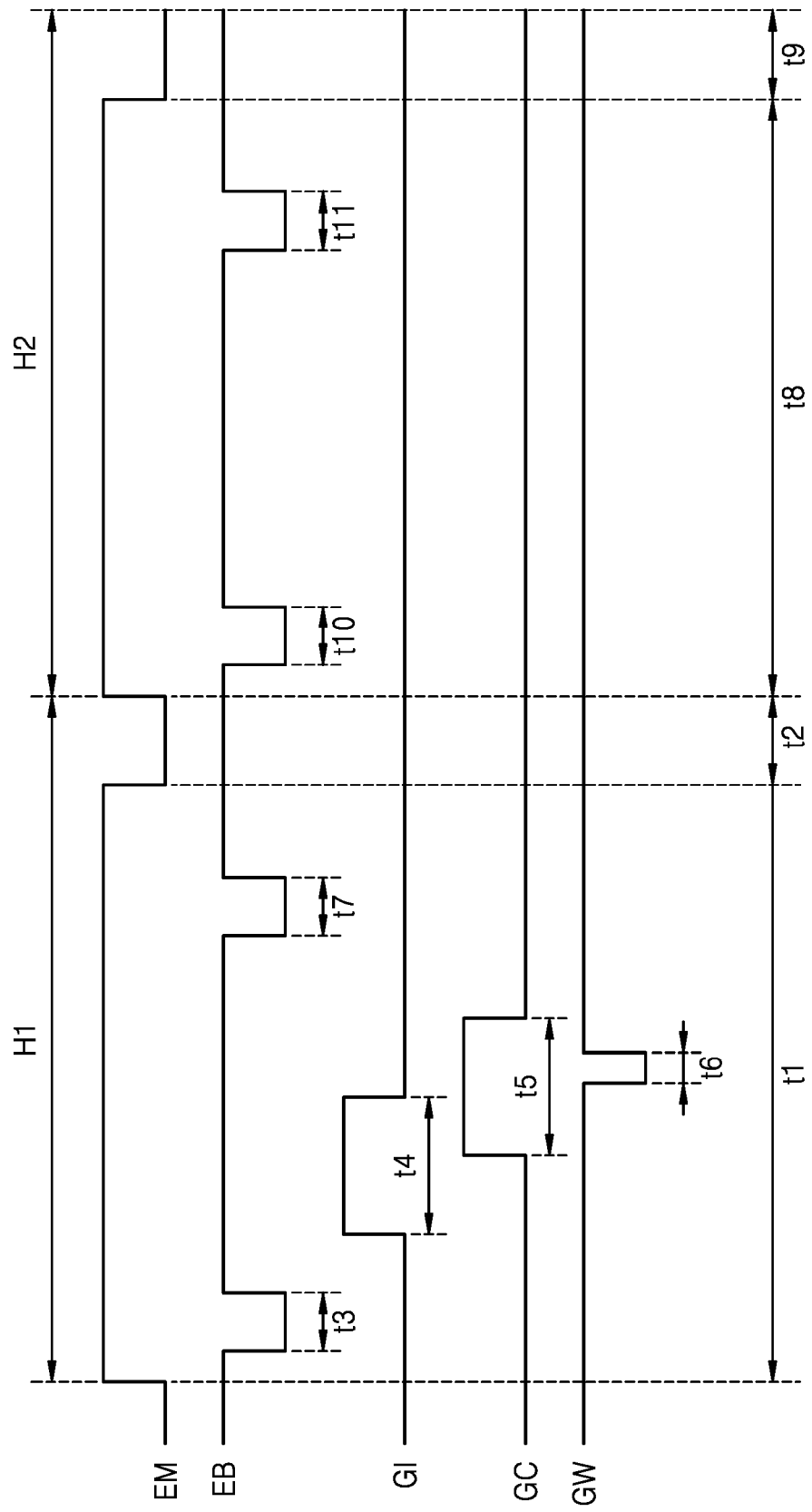
FIG. 4 is a timing diagram illustrating a method of driving sub-pixels according to an embodiment.

FIG. 3 is an equivalent circuit diagram of one sub-pixel of a display panel according to an embodiment, and FIG. 4 is a timing diagram illustrating a method of driving sub-pixels according to an embodiment.

Referring to FIG. 3, one sub-pixel Pa that is a display element may include an organic light-emitting diode (OLED) and a sub-pixel circuit PCa electrically connected to the organic light-emitting diode (OLED). The sub-pixel circuit PCa may include a plurality of transistors T1 through T8, and the plurality of transistors T1 through T8 may be implemented with thin film transistors. Depending on the type (p-type or n-type) or operating conditions of a transistor, a first terminal of each of the plurality of transistors T1 through T8 may be a source terminal or a drain terminal, and a second terminal of each of the plurality of transistors T1 through T8 may be a terminal different from the first terminal. For example, when the first terminal is a source terminal, the second terminal may be a drain terminal.

The sub-pixel circuit PCa may be connected to a first scan line GWL for transmitting a first scan signal GW, a second scan line GIL for transmitting a second scan signal GI, a third scan line GCL for transmitting a third scan signal GC, a light-emitting control line EL for transmitting an emission control signal EM, a bias control line EBL for transmitting a bias control signal EB, and a data line DL for transmitting a data signal DAT.

The driving voltage line PL may transmit a driving voltage VDD to a first thin film transistor T1 (a driving transistor). A driving initialization voltage line VIL may transmit a driving initialization voltage VINT to a gate electrode of the first thin film transistor T1. An initialization voltage line VAIL may transmit an initialization voltage AINT to one electrode of the OLED. A bias line VBL may transmit a bias voltage Vbias to a source terminal or drain terminal of the first thin film transistor T1.

The first thin film transistor T1 may include a gate terminal connected to a second node N2, a first terminal connected to a first node N1, and a second terminal connected to a third node N3. The first thin film transistor T1 may receive a data signal DATA according to a switching operation of the second thin film transistor T2 and may supply a driving current to the OLED.

The second thin film transistor T2 (a switching transistor) may include a gate terminal connected to the first scan line GWL, a first terminal connected to the data line DL, and a second terminal connected to the first node N1(or the first terminal of the first thin film transistor T1). The second thin film transistor T2 may be turned on according to the first scan signal GW received through the first scan line GWL and may perform a switching operation of transmitting the data signal DATA transmitted to the data line DL to the first node N1.

The third thin film transistor T3 (a compensation transistor) may include a gate terminal connected to the third scan line GCL, a first terminal connected to a third node (or a second terminal of the first thin film transistor T1), a first terminal connected to the second node (or a second terminal of the first thin film transistor T1), and a second terminal connected to the second node (or a gate terminal of the first thin film transistor T1). The third thin film transistor T3 may be turned on according to a third scan signal GC received through the third scan line GCL and may diode-connect the first thin film transistor T1.

The fourth thin film transistor T4 (a driving initialization transistor) may include a gate terminal connected to the second scan line GIL, a first terminal connected to the driving initialization voltage line VIL, and a second terminal connected to the second node (or the gate terminal of the first thin film transistor T1). The fourth thin film transistor T4 may be turned on according to the second scan signal GI received through the second scan line GIL and may transmit the driving initialization voltage VINT to the gate terminal of the first thin film transistor T1 to initialize the gate voltage of the first thin film transistor T1.

The fifth thin film transistor T5 (a first light-emitting control transistor) may include a gate terminal connected to the light-emitting control line EL, a first terminal connected to the driving voltage line PL, and a second terminal connected to the first node (or the first terminal of the first thin film transistor T1). The sixth thin film transistor T6 (a second light-emitting control transistor) may include a gate terminal connected to the light-emitting control line EL, a first terminal connected to the third node (or the second terminal of the first thin film transistor T1), and a second terminal connected to a pixel electrode of the OLED. The fifth thin film transistor T5 and the sixth thin film transistor T6 may be simultaneously turned on according to a light-emitting control signal EM received through the light-emitting control line EL so that a current flows through the OLED.

The seventh thin film transistor T7 (an initialization transistor) may include a gate terminal connected to the bias control line EBL, a first terminal connected to the second terminal of the sixth thin film transistor T6 and the pixel electrode of the OLED, and a second terminal connected to the initialization voltage line VAIL. The seventh thin film transistor T7 may be turned according to the bias control signal EB received through the bias control line EBL and may transmit the initialization voltage AINT to the pixel electrode of the OLED to initialize a voltage of the pixel electrode of the OLED.

The eighth thin film transistor T8 (a bias transistor) may include a gate terminal connected to the bias control line EBL, a first terminal connected to the bias line VBL, and a second terminal connected to the first node (or the first terminal of the first thin film transistor T1). The eighth thin film transistor T8 may be turned according to the bias control signal EB received through the bias control line EBL and may apply the bias voltage Vbias to the first terminal of the first thin film transistor T1, thereby controlling a current (a driving current) between the source terminal and the drain terminal of the first thin film transistor T1. For example, the seventh thin film transistor T7 and the eighth thin film transistor T8 may be simultaneously turned according to the bias control signal EB received through the bias control line EBL and may apply the bias voltage Vbias to the first terminal of the first thin film transistor T1 when the initialization voltage AINT is applied to the second terminal side of the first thin film transistor for initializing the voltage of the pixel electrode of the OLED, thereby controlling a current between the source terminal and the drain terminal of the first thin film transistor T1.

Portions of the plurality of thin film transistors T1 through T7 may be n-channel metal oxide semiconductor field effect transistors (NMOSs), and the other portions thereof may be p-channel MOSFETs (PMOSs). For example, the third thin film transistor T3 and the fourth thin film transistor T4 among the plurality of thin film transistors T1 through T7 may be NMOSs, and the other portions thereof may be PMOSs. Alternatively, the third thin film transistor T3, the fourth thin film transistor T4, and the seventh thin film transistor T7 among the plurality of thin film transistors T1 through T7 may be NMOSs, and the other portions thereof may be PMOSs. Alternatively, all of the plurality of thin film transistors T1 through T7 may be NMOSs or PMOSs. The plurality of thin film transistors T1 through T7 may include amorphous silicon or polysilicon. If necessary, the thin film transistor that is an NMOS may include an oxide semiconductor. Hereinafter, for convenience, a case where the third thin film transistor T3 and the fourth thin film transistor T4 are NMOSs including an oxide semiconductor, and the other portions of the plurality of thin film transistors T1 through T7 are PMOSs, will be described.

A capacitor Cst may include a first electrode connected to a second node (or a gate terminal of the first thin film transistor T1) and a second electrode connected to the driving voltage line PL.

The OLED may include a pixel electrode and an opposite electrode facing the pixel electrode, and a common voltage VSS may be applied to the opposite electrode. The opposite electrode may be a common electrode that is common in the plurality of pixels P. The common voltage VSS may be a voltage that is lower than the driving voltage VDD. The driving initialization voltage VINT and the initialization voltage AINT may be voltages that are lower than the common voltage VSS.

The OLED may receive the driving current from the first thin film transistor T1 and may emit a light of a certain color, thereby displaying an image. The OLED may include different materials for forming a light-emitting layer according to an emitted color so that characteristics (e.g., capacitance) of the OLED are different from each other. In particular, when the same initialization voltage AINT is applied during high-frequency driving, the same initialization of the pixel electrode may not be performed due to a difference in capacitances of the OLED, so that a problem may occur in image quality characteristics. In embodiments of the present disclosure, different initialization voltages AINT that are different according to a light-emitting color of each sub-pixel Pa are applied so that a deviation in the image quality characteristics for each sub-pixel Pa may be enhanced.

Referring to FIG. 4, one pixel P may operate in a scanning frame H1 and a blanking frame H2. During the scanning frame H1, the first through third scan signals GW, GI, and GC may be generated as an ON voltage. Here, the ON voltage may be a turn on voltage of a transistor, and the ON voltage of the first scan signal GW may be a low-level voltage, and the ON voltage of the second scan signal GI and the third scan signal GC may be a high-level voltage.

The scanning frame H1 may include first through seventh periods t1 through t7. During the first period t1, the light-emitting control signal EM supplied to the light-emitting control line EL may be maintained at a high level, and during the second period t2, the light-emitting control signal EM may be transited from a high level to a low level. In the second period t2, the fifth thin film transistor T5 and the sixth thin film transistor T6 may be turned on. A driving current corresponding to an electric charge stored in the capacitor Cst may be supplied to the OLED through the first thin film transistor T1 so that the OLED may emit light.

The third period t3 may be a first bias period in which the pixel electrode of the OLED is initialized and an on bias voltage is applied to the source terminal or drain terminal of the first thin film transistor T1. In the third period t3, the bias control signal EB at the low level may be applied to the bias control line EBL. Thus, the seventh thin film transistor T7 and the eighth thin film transistor T8 may be turned on. The initialization voltage AINT supplied by the turned-on seventh thin film transistor T7 from the initialization voltage line VAIL may be applied to the pixel electrode of the OLED. In this case, the bias voltage Vbias supplied by the turned-on eighth thin film transistor T8 from the bias line VBL may be applied to the first terminal of the first thin film transistor T1.

The fourth period t4 may be an initialization period in which the second node N2 to which the gate terminal of the first thin film transistor T1 is initialized and an ON bias voltage is applied to the gate terminal of the first thin film transistor T1. In the fourth period t4, the second scan signal GI at the high level may be applied to the second scan line GIL. Thus, the fourth thin film transistor T4 may be turned on, and a voltage of the second node N2, i.e., a voltage of the gate terminal of the first thin film transistor T1 may be initialized by the driving initialization voltage VINT supplied from the driving initialization voltage line VIL.

The fifth period t5 may be a compensation period in which a threshold voltage of the first thin film transistor T1 is compensated for. In the fifth period t5, a third scan signal GC at a high level may be applied to the third scan line GCL. Thus, the third thin film transistor T3 may be turned on.

The sixth period t6 may be a data writing period. The sixth period t6 may succeed not to overlap the fifth period t4 and is included in the fifth period t5. In the sixth period t6, the first scan signal GW at the low level may be applied to the first scan line GWL. Thus, the second thin film transistor T2 may be turned on, and the data signal DATA supplied from the data line DL may be transmitted to the first node N1. The first thin film transistor T1 may be diode-connected by the turned-on third thin film transistor T3, and a compensation voltage in which the threshold voltage of the first thin film transistor T1 is compensated for from the data signal DATA, may be applied to the second node N2, i.e., the gate terminal of the first thin film transistor T1. The driving voltage VDD and the compensation voltage may be applied to both ends of the capacitor Cst, and an electric charge corresponding to a difference in both-end voltages may be stored in the capacitor Cst.

The seventh period t7 may be a second bias period in which the pixel electrode of the OLED is initialized and a bias voltage is applied to the source terminal or drain terminal of the first thin film transistor T1 is applied, as in the third period t3. The third period t3 that is the first bias period may precede the fourth through sixth periods t4 through t6, and the seventh period t7 may succeed the fourth through sixth periods t4 through t6. That is, one scanning frame H1 may have two bias periods with the data writing period therebetween.

The blanking frame H2 may include eighth through eleventh periods t8 through t11. During the eighth period t8, the light-emitting control signal EM supplied to the light-emitting control line EL may be maintained at a high level, and during the ninth period t9, the light-emitting control signal EM may be transited from a high level to a low level. In the ninth period t9, the fifth thin film transistor T5 and the sixth thin film transistor T6 may be turned on. However, because during the blanking frame H2, an electric charge is not stored in the capacitor Cst, the OLED may not emit light.

The eighth period t8 may include the tenth period t10 and the eleventh period t11. The tenth period t10 and the eleventh period t11 may be a third bias period and a fourth bias period in which the pixel electrode of the OLED is initialized and an ON bias voltage is applied to the source terminal or the drain terminal of the first thin film transistor T1.

Depending on the driving frequency of the pixel P, the number of times of repetitions of the scanning frame H1 and the blanking frame H2 may be determined. For example, after the scanning frame H1 is repeated, the blanking frame H2 may be repeated M times, and N and M may be numbers that are the same or different from each other.

Figure 5:
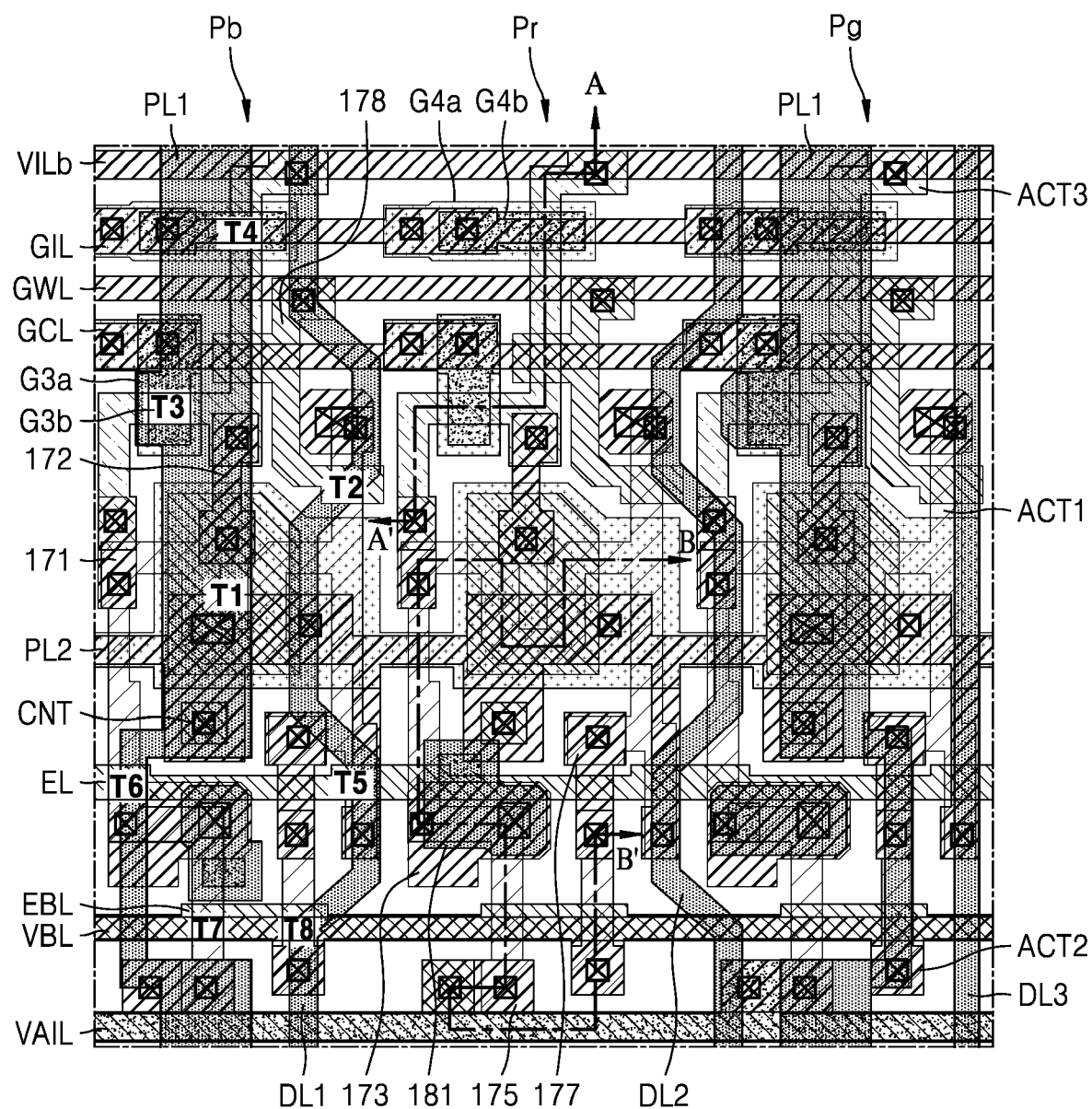
FIG. 5 is a plan view schematically illustrating positions of a plurality of thin film transistors and capacitors arranged on a pixel circuit of one pixel according to an embodiment.
Figure 6:
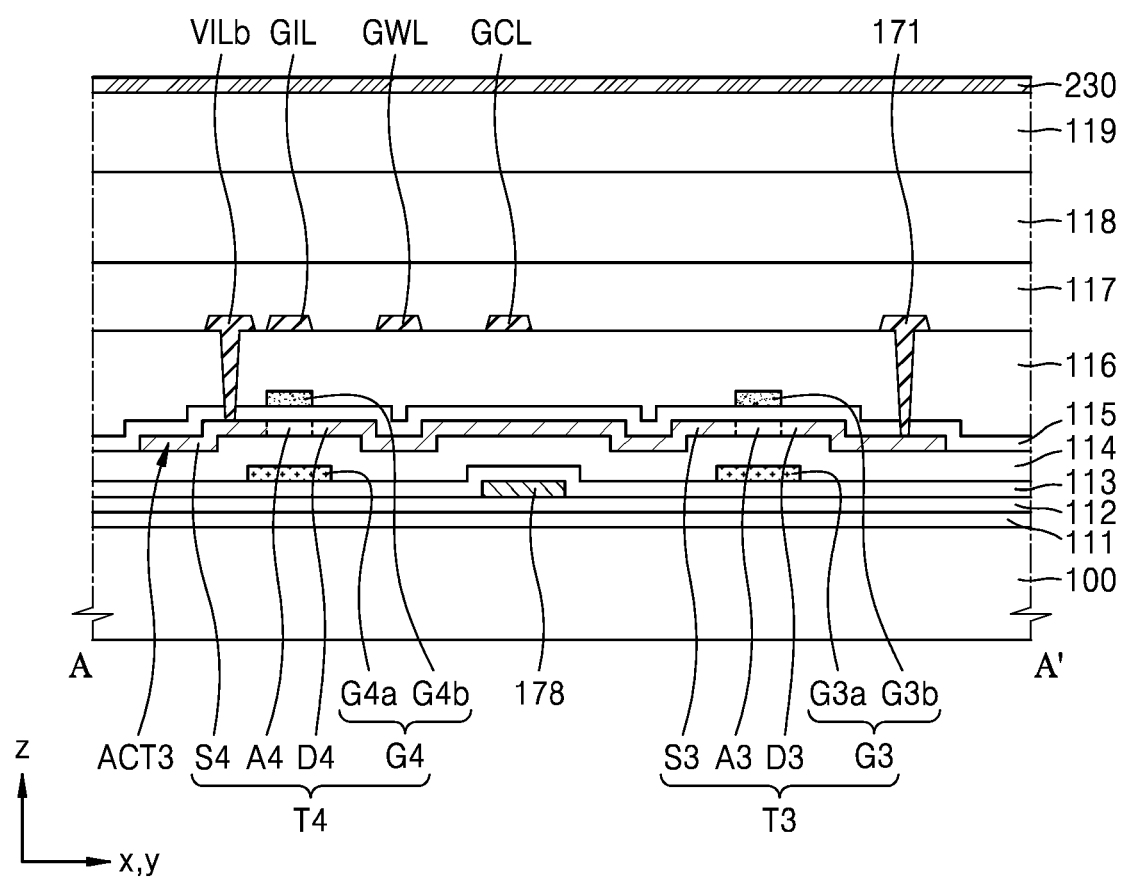
FIG. 6 is a cross-sectional view of a display panel according to an embodiment taken along a line A-A' of FIG. 5.

FIG. 5 is a plan view schematically illustrating positions of a plurality of thin film transistors and capacitors arranged in a pixel circuit of one pixel according to an embodiment, FIG. 6 is a cross-sectional view of a display panel according to an embodiment taken along a line A-A' of FIG. 5, and FIGS. 7A, 7B, 8A, and 8B are cross-sectional views of a display panel according to an embodiment taken along a line B-B' of FIG. 5, according to embodiments.

In FIGS. 6 through 8, for convenience of explanation, components duplicated by bending of the line A-A' or B-B' are displayed only once, and the length of a path and the length of components shown in the drawings may not be proportional to each other.

Referring to FIG. 5, one pixel P may include a plurality of sub-pixels Pb, Pr, and Pg. For example, one pixel P may include a first sub-pixel Pb that emits light of a blue color, a second sub-pixel Pr that emits light of a red color, and a third sub-pixel Pg that emits light of a green color. However, in embodiments of the present disclosure, sub-pixels are not limited to red sub-pixels, green sub-pixels, and blue sub-pixels, and the sub-pixels may be one among sub-pixels that emit lights of red, blue, green, and white colors or sub-pixels that emit light of other colors than red, blue, green, and white colors. Also, in FIG. 5, one pixel P includes three sub-pixels Pb, Pr, and Pg. However, the number and arrangement of sub-pixels that constitute one pixel P may be variously design-changed. Hereinafter, an example in which one pixel P includes a first sub-pixel Pb, a second sub-pixel Pr and a third sub-pixel Pg that emit light of blue, red and green colors, respectively, will be described.

In an embodiment, sub-pixels Pb, Pr, and Pg that constitute one pixel P may have a similar arrangement structure. For example, the arrangement of a plurality of transistors and capacitors of each of sub-pixels Pb, Pr and Pg may be the same, and there may be a difference in the arrangements of wirings for connecting them. One pixel P may be repeatedly arranged in the display area DA.

Data lines DL may extend in the first direction (e.g., a y-direction) and may be spaced apart from each other in each sub-pixel column. Driving voltage lines PL may include a first driving voltage line PL1 and a second driving voltage line PL2 arranged in different layers. The first driving voltage line PL1 may extend in the first direction (e.g., a y-direction), the second driving voltage line PL2 may extend in the second direction (e.g., an x-direction) crossing the first direction (e.g., a y-direction), and the first driving voltage line PL1 and the second driving voltage line PL2 may be electrically connected to each other. The first scan line GWL, the second scan line GIL, the light-emitting control line EL, a horizontal driving initialization voltage line VILb, an initialization voltage line VAIL, a bias control line EBL, and a bias line VBL may extend in the second direction (e.g., an x-direction). The initialization voltage line VAIL may include vertical voltage lines extending in the first direction (e.g., a y-direction) and horizontal voltage lines extending in the second direction (e.g., an x-direction). The horizontal voltage lines may overlap each other in a plan view, and one vertical voltage line and one horizontal voltage line may be electrically connected to each other.

Hereinafter, the following description will be provided with reference to FIGS. 6 through 8.

The substrate 100 may include a glass material, a ceramic material, a metal material, or a flexible or bendable material. When the substrate 100 has flexible or bendable characteristics, the substrate 100 may include a polymer resin such as polyethersulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

The substrate 100 may have a multi-layered structure. For example, the substrate 100 may have a structure in which a first base layer, a first barrier layer, a second base layer and a second barrier layer are sequentially stacked to each other. The first base layer and the second base layer may include the above-described polymer resin. The first barrier layer and the second barrier layer that are layers for preventing penetration of external foreign substances, may have a single layer or multi-layered structure including an inorganic material such as silicon nitride (SiNx) or silicon oxide (SiOx).

The buffer layer 111 may be configured to increase smoothness of a top surface of the substrate 100, and the buffer layer 111 may be provided as an oxide layer such as silicon oxide (SiOx) or a nitride layer such as silicon nitride (SiNx), or silicon oxynitride (SiON).

In an embodiment, a lower metal layer (not shown) may be arranged between the substrate 100 and the buffer layer 111. The lower metal layer may be arranged between the substrate 100 and a first semiconductor pattern ACT1 and may be configured to block light that may be incident onto the first semiconductor pattern ACT1. For example, the lower metal layer may be arranged to overlap the first thin film transistor T1 in a plan view and may be configured to block light that may be incident into a channel region of the first thin film transistor T1. The lower metal layer may include molybdenum (Mo), aluminum (Al), copper (Cu), titanium (Ti), or the like and may have a multi-layered or single layer structure.

In an embodiment, a voltage may be applied to the lower metal layer. In this regard, in FIG. 5, the driving voltage VDD is applied to the lower metal layer through a connector CNT in which the first driving voltage line PL1 is positioned in the display area DA. Thus, characteristics of a thin film transistor may be further stabilized.

The first semiconductor pattern ACT1 and a second semiconductor pattern ACT2 may include low temperature poly-silicon (LTPS). In an embodiment, the first semiconductor pattern ACT1 and the second semiconductor pattern ACT2 may also be formed as amorphous silicon (a-Si) or an oxide semiconductor. The first semiconductor pattern ACT1 and the second semiconductor pattern ACT2 may be arranged on the same layer. For example, the first semiconductor pattern ACT1 and the second semiconductor pattern ACT2 may be arranged on a first semiconductor layer. The first semiconductor pattern ACT1 may include semiconductor layers of the first thin film transistor T1, the second thin film transistor T2, and the fifth through seventh thin film transistors T5 through T7, and the second semiconductor pattern ACT2 may include a semiconductor layer of the eighth thin film transistor T8.

Each of semiconductor layers of the first thin film transistor T1, the second thin film transistor T2, and the fifth through seventh thin film transistors T5 through T7 and a semiconductor layer of the eighth thin film transistor T8 may include a source region, a drain region, and a channel region between the source region and the drain region. The channel region may be a region overlapping the gate electrode. The source region and the drain region may be regions in which an impurity is doped in the vicinity of the channel region. The positions of the source region and the drain region may be changed according to an embodiment. The source region and the drain region may be a source electrode and a drain electrode of a thin film transistor in some cases. The gate electrode, the source region, and the drain region shown in FIG. 5 may correspond to the gate terminal, the first terminal, and the second terminal shown in FIG. 3, respectively.

A first gate insulating layer 112 may be positioned on a first semiconductor layer including the first semiconductor pattern ACT1 and the second semiconductor pattern ACT2.

The first gate insulating layer 112 may include one or more materials of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A first conductive layer including gate electrodes of the first thin film transistor T1, the second thin film transistor T2, and the fifth through eighth thin film transistors T5 through T8, the light-emitting control line EL, and the bias control line EBL may be arranged on the first gate insulating layer 112.

A gate electrode G1 of the first thin film transistor T1 and a gate electrode of the second thin film transistor T2 may overlap the first semiconductor pattern ACT1. A gate electrode G7 of the seventh thin film transistor T7 may be a portion of the bias control line EBL that intersects a portion of the first semiconductor pattern ACT1. A gate electrode G8 of the eighth thin film transistor T8 may be another portion of the bias control line EBL that intersects the second semiconductor pattern ACT2. A gate electrode of the fifth thin film transistor T5 and a gate electrode G6 of the sixth thin film transistor T6 may be portions of the light-emitting control line EL that intersects portions of the first semiconductor pattern ACT1.

In an embodiment, a gate electrode of the second thin film transistor T2 may be a portion of a conductive pattern 178 electrically connected to the first scan line GWL. A portion of the conductive pattern 178 may overlap a portion of the third semiconductor layer ACT3 in a plan view. A portion of the conductive pattern 178 and a portion of the third semiconductor layer ACT3 that overlap each other may function as a capacitor so that a voltage applied to the first thin film transistor T1 may be stabilized.

A second gate insulating layer 113 may be arranged on the first conductive layer. The second gate insulating layer 113 may include one or more materials of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A second conductive layer including an upper electrode Cst2 of the capacitor Cst, a lower gate electrode G3a of the third thin film transistor T3, and a lower gate electrode G4a of the fourth thin film transistor T4 may be arranged on the second gate insulating layer 113.

The upper electrode Cst2 of the capacitor Cst may cover at least a portion of the gate electrode G1 of the first thin film transistor T1 and may form the capacitor Cst together with the gate electrode G1 of the first thin film transistor T1. The lower electrode Cst1 of the capacitor Cst may be formed integrally with the gate electrode G1 of the first thin film transistor T1. For example, the gate electrode G1 of the first thin film transistor T1 may perform a function as the lower electrode Cst1 of the capacitor Cst. An opening SOP may be formed in the upper electrode Cst2 of the capacitor Cst. Through the opening SOP, a second connection wiring 173 may electrically connect the lower electrode Cst1 of the capacitor Cst to a drain region D3 of the third thin film transistor T3 and a drain region D4 of the fourth thin film transistor T4.

A lower gate electrode G3a of the third thin film transistor T3 may be provided in an island type to overlap the third semiconductor pattern ACT3. Similarly, a lower gate electrode G4a of the fourth thin film transistor T4 may be provided in an island type to overlap the third semiconductor pattern ACT3.

The second conductive layer may include one or more materials of Al, platinum (Pt), palladium (Pd), silver (Ag), magnesium (Mg), gold (Au), nickel (Ni), neodymium (Nd), iridium (Jr), chromium (Cr), lithium (Li), calcium (Ca), Mo, Ti, tungsten (W), and copper (Cu) and may have a single layer or multi-layered structure.

A first interlayer insulating layer 114 may be positioned on the second conductive layer. The first interlayer insulating layer 114 may include one or more materials of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second semiconductor layer including the third semiconductor pattern ACT3 may be positioned on the first interlayer insulating layer 114. In an embodiment, the third semiconductor pattern ACT3 may include an oxide semiconductor. The third semiconductor pattern ACT3 may include semiconductors of the third thin film transistor T3 and the fourth thin film transistor T4.

The semiconductor layers of the third thin film transistor T3 and the fourth thin film transistor T4 may include a source region, a drain region, and a channel region between the source region and the drain region. The channel region may be a region overlapping the gate electrode. The source region and the drain region may be regions in which an impurity is doped in the vicinity of the channel region. The positions of the source region and the drain region may be changed according to an embodiment, and the source region and the drain region may be a source electrode and a drain electrode of the thin film transistor in some cases.

A third gate insulating layer 115 may be positioned on the second semiconductor layer. The third gate insulating layer 115 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A third conductive layer including an upper gate electrode G3b of the third thin film transistor T3 and an upper gate electrode G4b of the fourth thin film transistor T4 may be positioned on the third gate insulating layer 115.

The upper gate electrode G3b of the third thin film transistor T3 may overlap the lower gate electrode G3a. Similarly, the upper gate electrode G4b of the fourth thin film transistor T4 may overlap the lower gate electrode G4a. That is, the third thin film transistor T3 and the fourth thin film transistor T4 may have a double gate structure including a gate electrode on an upper portion and a lower portion of the semiconductor layer, respectively.

The third conductive layer may include one or more materials of aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu) and may have a single layer or multi-layered structure.

Figure 7A:
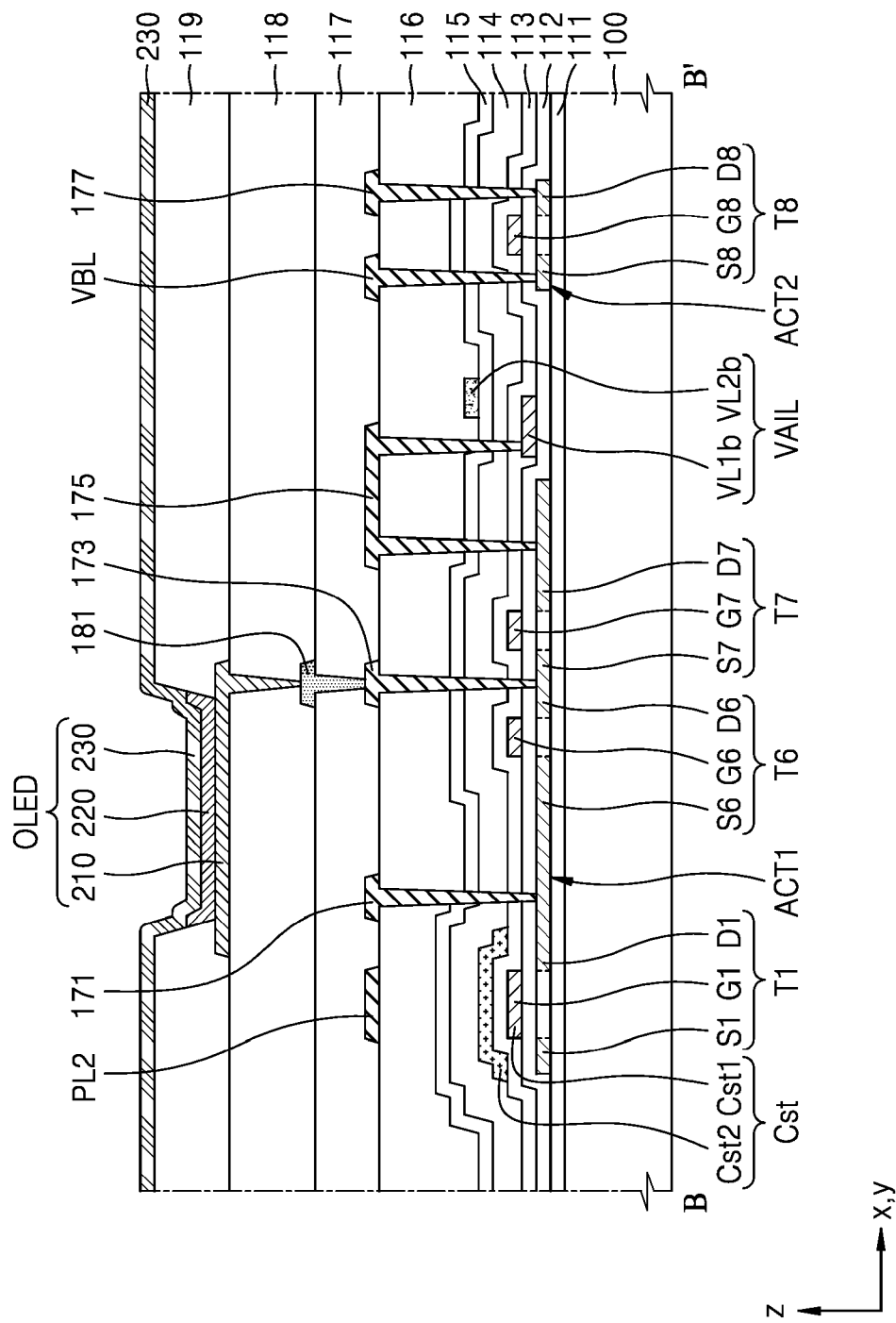
FIGS. 7A and 7B are cross-sectional views of a display panel according to an embodiment taken along a line B-B' of FIG. 5 according to embodiments.
Figure 7B:
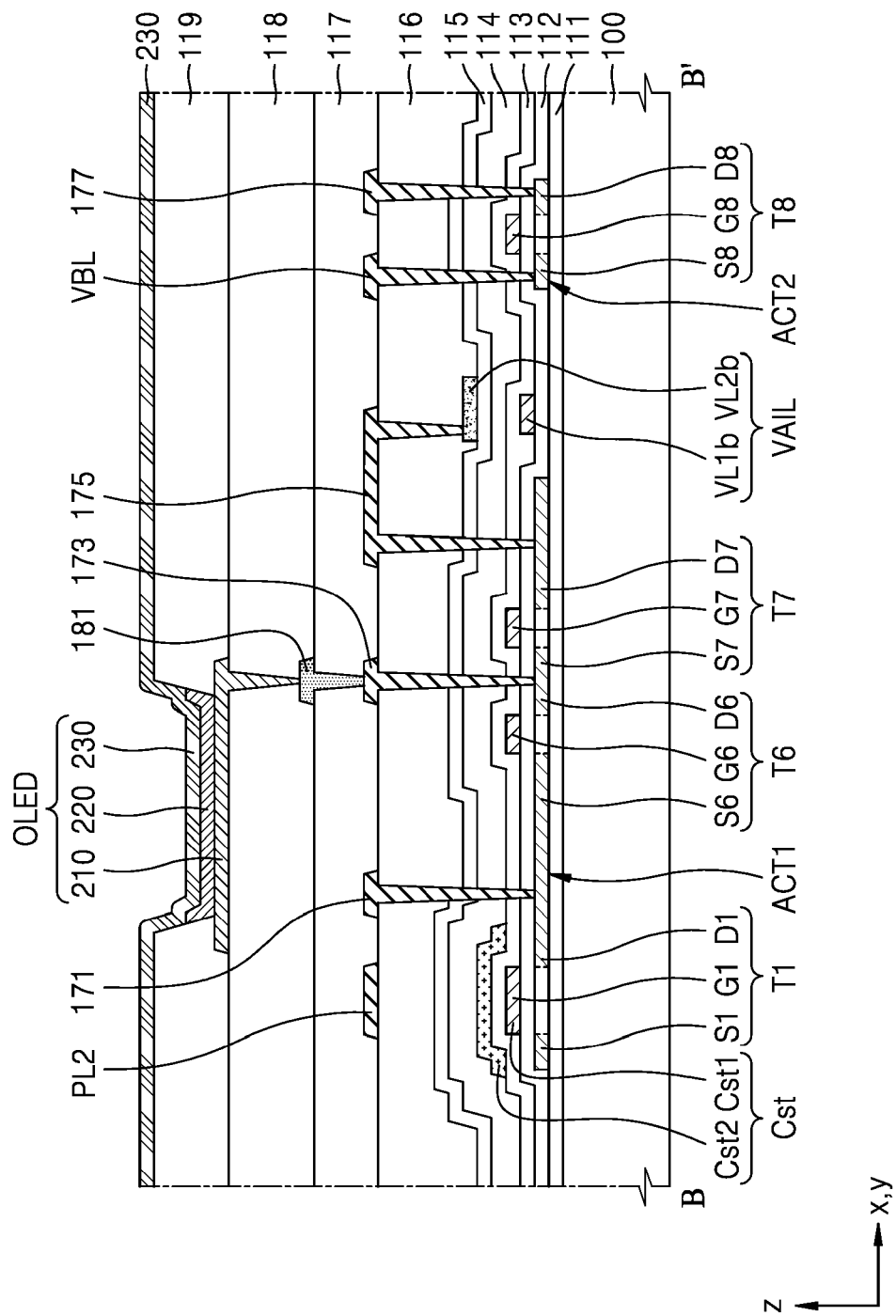

In an embodiment, as shown in FIGS. 7A and 7B, the first horizontal voltage line VL1b of the initialization voltage line VAIL may be arranged on the first gate insulating layer 112, and the second horizontal voltage line VL2b of the initialization voltage line VAIL may be arranged on the third gate insulating layer 115. For example, the first horizontal voltage line VL1b may be arranged on the same layer as the first conductive layer, and the second horizontal voltage line VL2b may be arranged on the same layer as the third conductive layer.

Figure 8A:
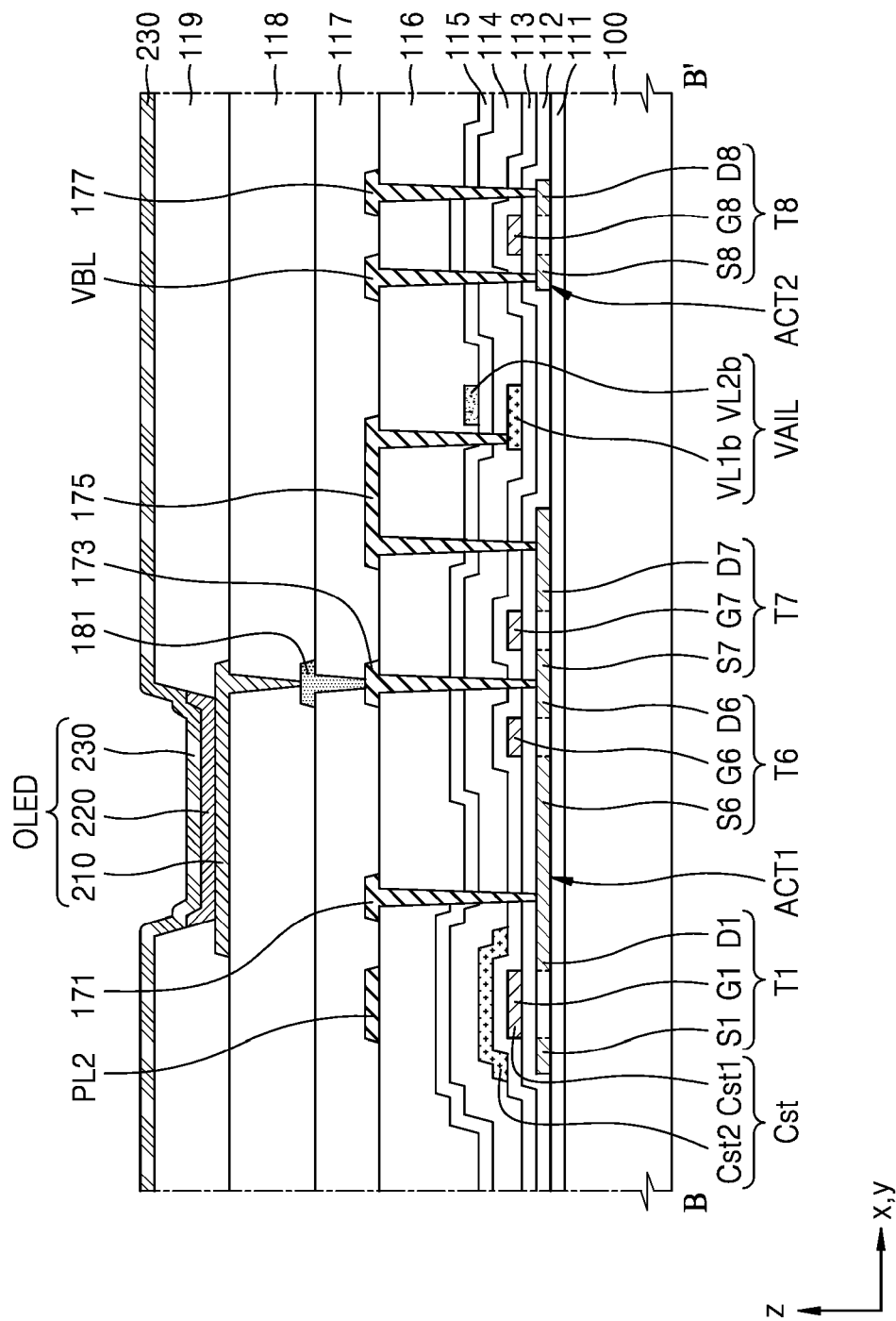
FIGS. 8A and 8B are cross-sectional views of a display panel according to an embodiment taken along the line B-B' of FIG. 5 according to embodiments.
Figure 8B:
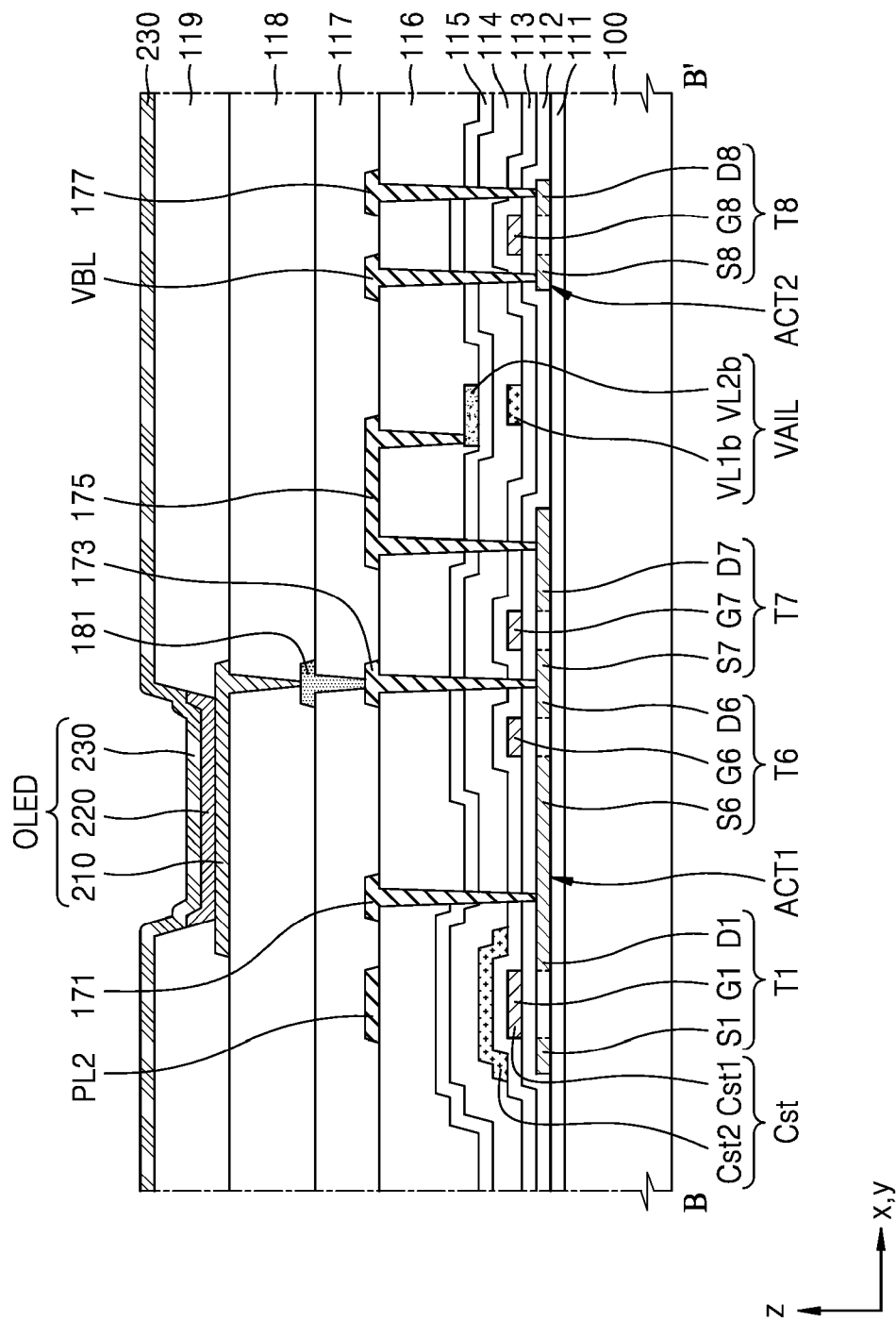

In another embodiment, as shown in FIGS. 8A and 8B, the first horizontal voltage line VL1b of the initialization voltage line VAIL may be arranged on the second gate insulating layer 113, and the second horizontal voltage line VL2b may be arranged on the third gate insulating layer 115. For example, the first horizontal voltage line VL1b may be arranged on the same layer as the second conductive layer, and the second horizontal voltage line VL2b may be arranged on the same layer as the third conductive layer.

In another embodiment, the first horizontal voltage line VL1b of the initialization voltage line VAIL may be arranged on the first gate insulating layer 112, and the second horizontal voltage line VL2b may be arranged on the second gate insulating layer 113. For example, the first horizontal voltage line VL1b may be arranged on the same layer as the first conductive layer, and the second horizontal voltage line VL2b may be arranged on the same layer as the second conductive layer.

The first horizontal voltage line VL1b and the second horizontal voltage line VL2b may overlap each other in a plan view. Thus, different initialization voltages (see AINT of FIG. 3) may be applied according to the color emitted by each pixel without increasing the area of one pixel P.

A second interlayer insulating layer 116 may be positioned on the third conductive layer. The second interlayer insulating layer 116 may include an inorganic insulating material or an organic insulating material. In an embodiment, the second interlayer insulating layer 116 may include one or more materials of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). In another embodiment, the second interlayer insulating layer 116 may include a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A fourth conductive layer including the first scan line GWL, the second scan line GIL, the third scan line GCL, the horizontal driving initialization voltage line VILb, the second driving voltage line PL2, and connection wirings 171, 172, 173, 175, and 177 for connecting the components may be positioned on the second interlayer insulating layer 116.

The fourth conductive layer may include a conductive material including Mo, Al, Cu, and Ti, and may have a multi-layered or single layer structure including the above-described materials. In an embodiment, the fourth conductive layer may have a multi-layered structure of titanium/aluminum/titanium (Ti/Al/Ti).

The first scan line GWL may extend in the second direction (e.g., an x-direction) and may be electrically connected to the gate electrode of the second thin film transistor T2 through a contact hole.

The second scan line GIL may extend in the second direction (e.g., an x-direction) and may be electrically connected to the lower gate electrode G4a and the upper gate electrode G4b of the fourth thin film transistor T4 through contact holes.

The third scan line GCL may extend in the second direction (e.g., an x-direction) and may be electrically connected to the lower gate electrode G3a and the upper gate electrode G3b of the third thin film transistor T3 through contact holes.

The horizontal driving initialization voltage line VILb may extend in the second direction (e.g., an x-direction), and the horizontal driving initialization voltage line VILb may be electrically connected to a source region S4 of the fourth thin film transistor T4 and a driving initialization voltage line VILa to be described later through the contact hole.

The second driving voltage line PL2 may extend in the second direction (e.g., an x-direction) and may be electrically connected to the upper electrode Cst2 of the capacitor Cst through the contact hole. A protruding region that extends in the first direction (e.g., a y-direction) from the second driving voltage line PL2 may be electrically connected to the source region of the fifth thin film transistor T5 through the contact hole.

One end of the first connection wiring 171 may be electrically connected to a drain region D3 of the third thin film transistor T3 through the contact hole, and the other end of the first connection wiring 171 may be electrically connected to a drain region D1 of the first thin film transistor T1 through the contact hole.

One end of the second connection wiring 172 may be electrically connected to a source region S3 of the third thin film transistor T3 and a drain region D4 of the fourth thin film transistor T4 through the contact hole, and the other end of the second connection wiring 172 may be electrically connected to the gate electrode G1 of the first thin film transistor T1 through the contact hole.

The first connection electrode 173 may be electrically connected to a drain region D6 of the sixth thin film transistor T6 through the contact hole.

One end of the third connection wiring 175 may be electrically connected to a drain region D7 of the seventh thin film transistor T7 through the contact hole, and the other end of the third connection wiring 175 may be electrically connected to the first horizontal voltage line VL1b or the second horizontal voltage line VL2b of the initialization voltage line VAIL through the contact hole. In an embodiment, as shown in FIGS. 7A and 8A, a sub-pixel to which a first initialization voltage is applied, among the plurality of sub-pixels that constitute one pixel P may be electrically connected to the first horizontal voltage line VL1b through the third connection wiring 175. As shown in FIGS. 7B and 8B, a sub-pixel to which a second initialization voltage is applied, among the plurality of sub-pixels that constitute one pixel P may be electrically connected to the second horizontal voltage line VL2b through the third connection wiring 175.

One end of the fourth connection wiring 177 may be electrically connected to a drain region D8 of the eighth thin film transistor T8 through the contact hole, and the other end of the fourth connection wiring 177 may be electrically connected to a source region S of the first thin film transistor T1 and a source region of the fifth thin film transistor T5 through the contact hole.

A first planarization layer 117 may be positioned on a fourth conductive layer, and a fifth conductive layer including the second connection electrode 181, the first driving voltage line PL1, and the data line DL may be positioned on the first planarization layer 117.

The fifth conductive layer may include a conductive material including Mo, Al, Cu, and Ti, and may have a multi-layered or single layer structure including the above-described materials. In an embodiment, the fifth conductive layer may have a multi-layered structure of titanium/aluminum/titanium (Ti/Al/Ti).

The first driving voltage line PL1 may extend in the first direction (e.g., a y-direction) and may be electrically connected to the second driving voltage line PL2 through the contact hole. In an embodiment, the first driving voltage line PL1 may be arranged only on portions of the sub-pixels Pb, Pr, and Pg that constitute one pixel P. For example, the first sub-pixel Pb and the third sub-pixel Pg may include the first driving voltage line PL1, and the first driving voltage line PL1 may be omitted from the second sub-pixel Pr arranged between the first sub-pixel Pb and the third sub-pixel Pg.

The data line DL may extend in the first direction (e.g., a y-direction) and may be electrically connected to the source region S2 of the second thin film transistor T2 through the contact hole. In an embodiment, the data line DL may have bending in the second direction (e.g., an x-direction). For example, the first data line DL1 electrically connected to the source region S2 of the second thin film transistor T2 of the first sub-pixel Pb and the second data line DL2 electrically connected to the source region S2 of the second thin film transistor T2 of the second sub-pixel Pr may have a bilateral symmetry based on a virtual line extending in the first direction (e.g., a y-direction). In this case, the third data line DL3 electrically connected to the source region S2 of the second thin film transistor T2 of the third sub-pixel Pg may have a shape of a straight line extending in the first direction (e.g., a y-direction).

Figure 14:
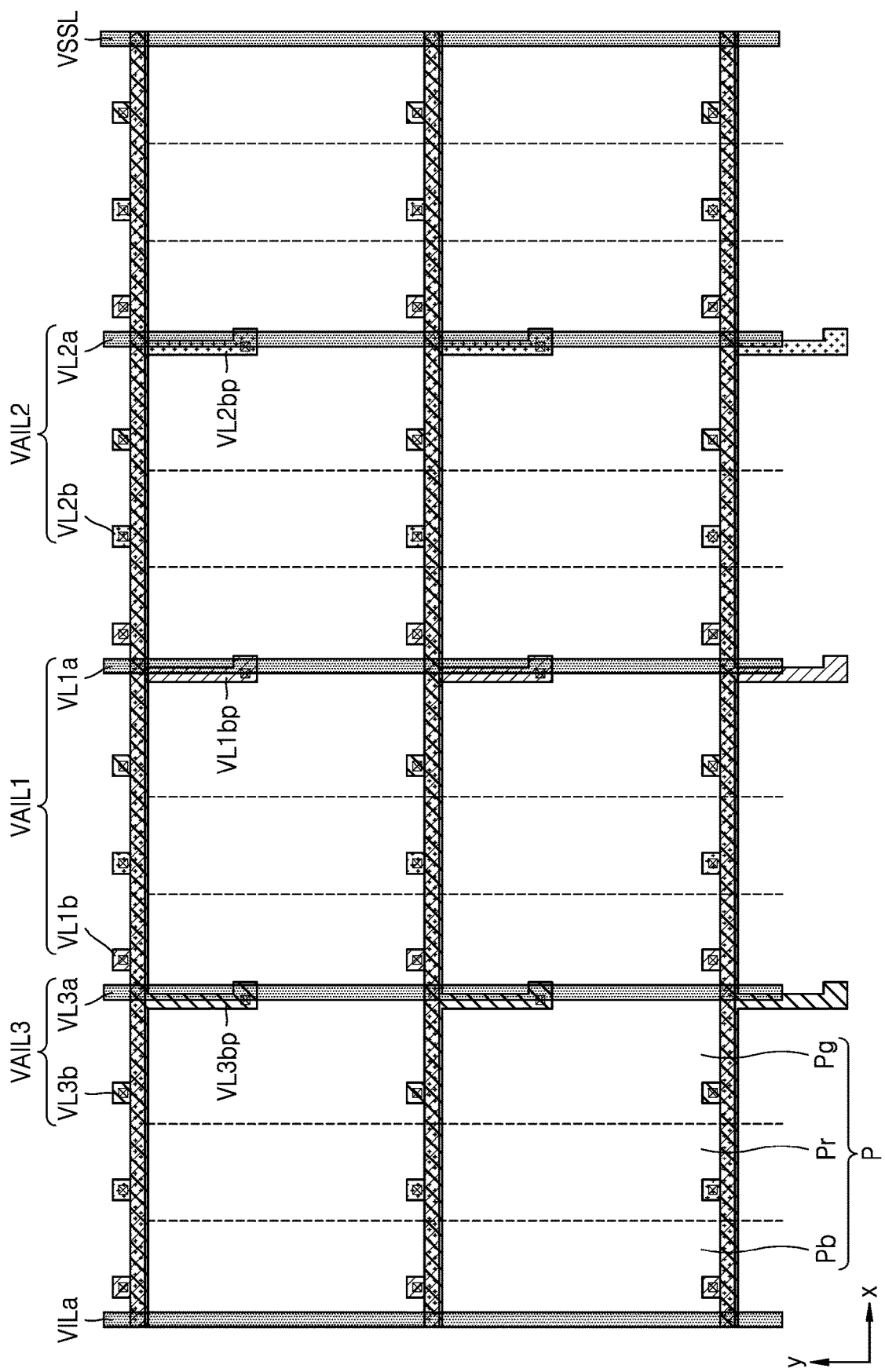
FIG. 14 is an enlarged plan view of a portion of a display panel according to an embodiment.

The fifth conductive layer may further include vertical voltage lines (see VL1 and VL2 of FIG. 14) of the initialization voltage line VAIL, the driving initialization voltage line (see VILa of FIG. 14), and a common voltage line (see VSSL of FIG. 14). The vertical voltage lines VL1 and VL2 of the initialization voltage line VAIL, the driving initialization voltage line VILa, and the common voltage line VSSL may be sequentially repeatedly arranged with one pixel P therebetween.

A second planarization layer 118 may be positioned on the fifth conductive layer. The second planarization layer 118 may have a single layer or multi-layer structure of a layer including an organic insulating material. The second planarization layer 118 may include a general-purpose polymer such as benzocyclobutene (BCB), polyimide, hexamethyldisiloxane (HMDSO), polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A pixel-defining layer 119 may be arranged on the second planarization layer 118, and the pixel-defining layer 119 may have an opening through which a portion of the pixel electrode 210 is exposed, thereby being configured to define a light-emitting region of a sub-pixel. Also, the pixel-defining layer 119 may be configured to increase a distance between an edge of the pixel electrode 210 and the opposite electrode 230, thereby preventing an arc or the like from occurring in the edge of the pixel electrode 210. The pixel-defining layer 119 may include an organic insulating material, such as polyimide, polyimide, an acrylic resin, BCB, HMDSO, and a phenol resin.

In some embodiment, the pixel-defining layer 119 may include a light-blocking material and may be provided in black. The light-blocking material may include carbon black, carbon nanotubes, a resin or paste including a black dye, metal particles, for example, nickel (Ni), aluminum (Al), molybdenum (Mo), and an alloy thereof, metal oxide particles (e.g., chromiumn oxide), or metal nitride particles (e.g., chromium nitride). When the pixel-defining layer 119 includes the light-blocking material, external light reflection due to metal structures arranged on a lower portion of the pixel-defining layer 119 may be reduced.

The OLED may include a pixel electrode 210, a light-emitting layer 220, and an opposite electrode 230. FIGS. 6, 7A, 7B, 8A, and 8B illustrate only the light-emitting layer 220 for convenience of illustration. However, the OLED may further include a first functional layer or a second functional layer on an upper layer or a lower layer of the light-emitting layer 220. In an embodiment, the pixel electrode 210 may be arranged to overlap the first thin film transistor T1 in a plan view. In another embodiment, the pixel electrode 210 may be arranged to overlap the seventh thin film transistor T7 and the eighth thin film transistor T8 in a plan view. In an embodiment, the light-emitting layer 220 is patterned to correspond to the pixel electrode 210, as shown in the drawings. However, in another embodiment, the light-emitting layer 220, the first functional layer or the second functional layer may be a layer patterned to correspond to each of the plurality of pixel electrodes 210 or a layer that is integrally formed over the plurality of pixel electrodes 210. The opposite electrode 230 may be integrally formed to correspond to the plurality of pixel electrodes 210.

Although not shown, a thin film encapsulation layer (not shown) or a sealing substrate (not shown) may be arranged on the opposite electrode 230 to cover the OLED to protect them. The thin film encapsulation layer (not shown) may cover a display area (see DA of FIG. 1) and may extend to an outside of the display area DA. The thin film encapsulation layer may include an inorganic encapsulation layer including at least one inorganic material and an organic encapsulation layer including at least one organic material. In some embodiment, the thin film encapsulation layer may be provided in a structure in which a first inorganic encapsulation layer/an organic encapsulation layer/a second inorganic encapsulation layer are stacked. The sealing substrate (not shown) may be arranged to face the substrate 100 and may be bonded to the substrate 100 by using a sealing member, such as a sealant or frit, in the peripheral area (see PA of FIG. 1).

Also, a spacer for preventing a mask from being stamped may be further included on the pixel-defining layer 119.

Figure 9:
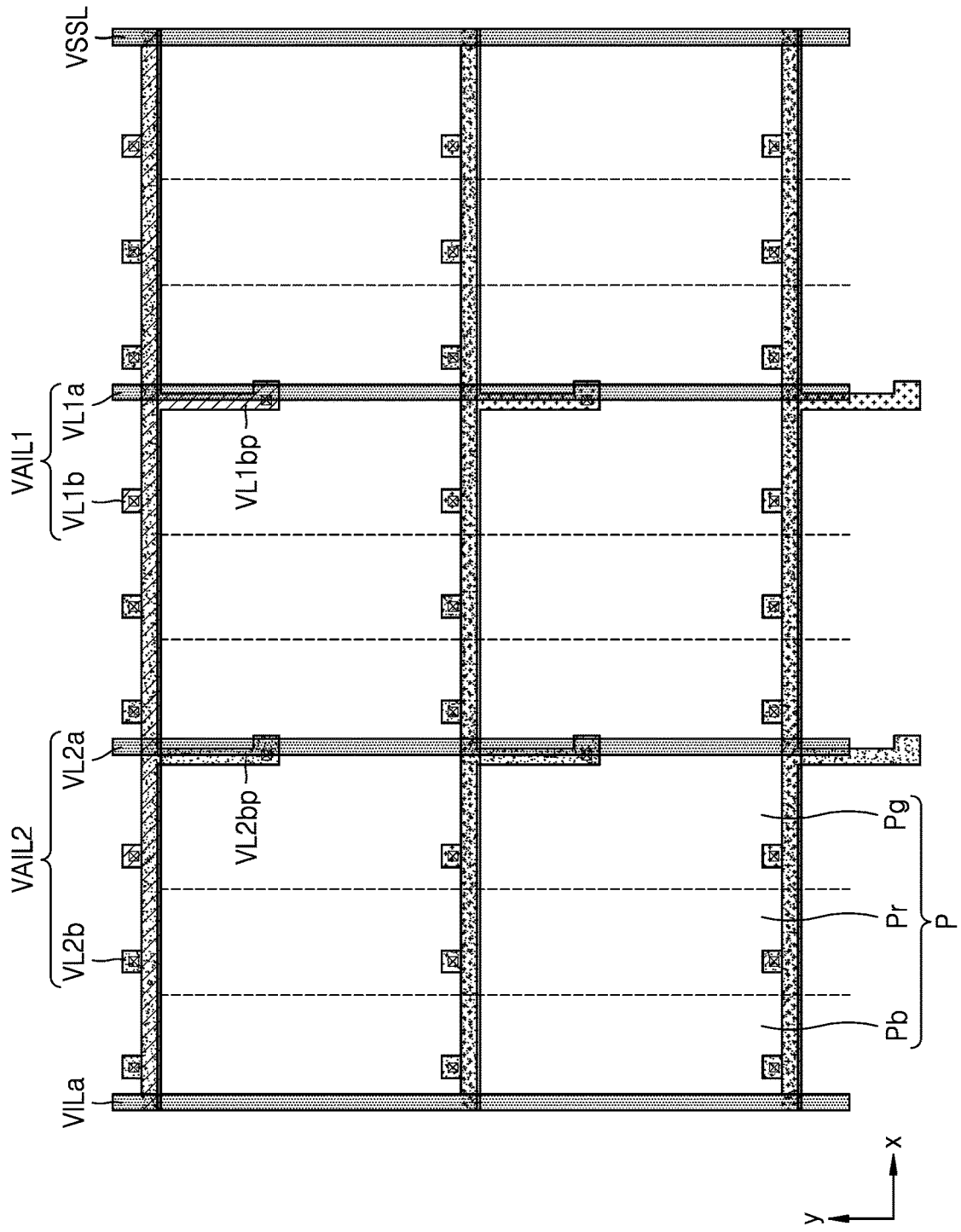
FIG. 9 is an enlarged plan view of a portion of a display panel according to an embodiment.
Figure 10:
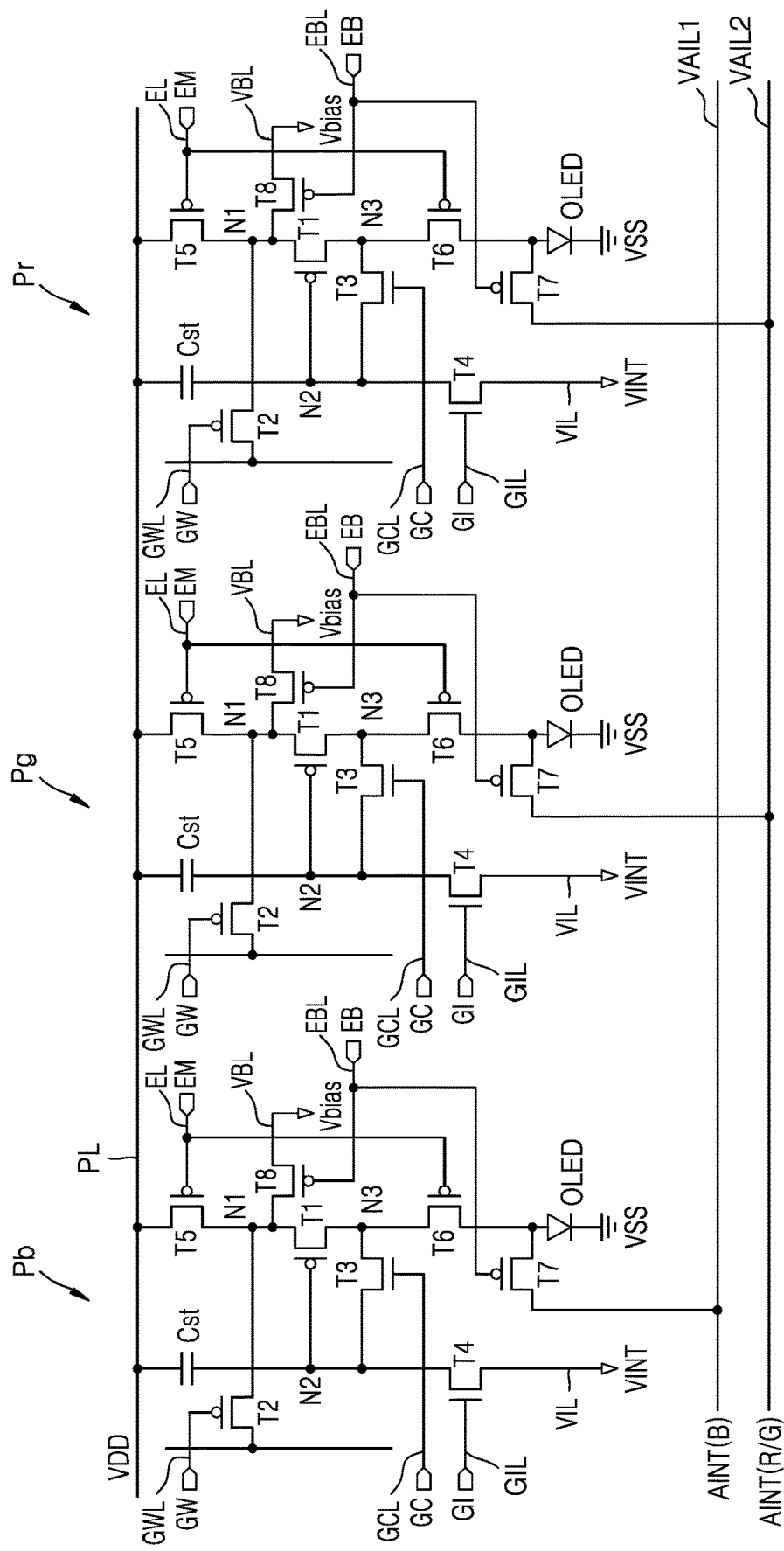
FIGS. 10, 11, and 12 are circuit diagrams illustrating one pixel according to embodiments.
Figure 11:
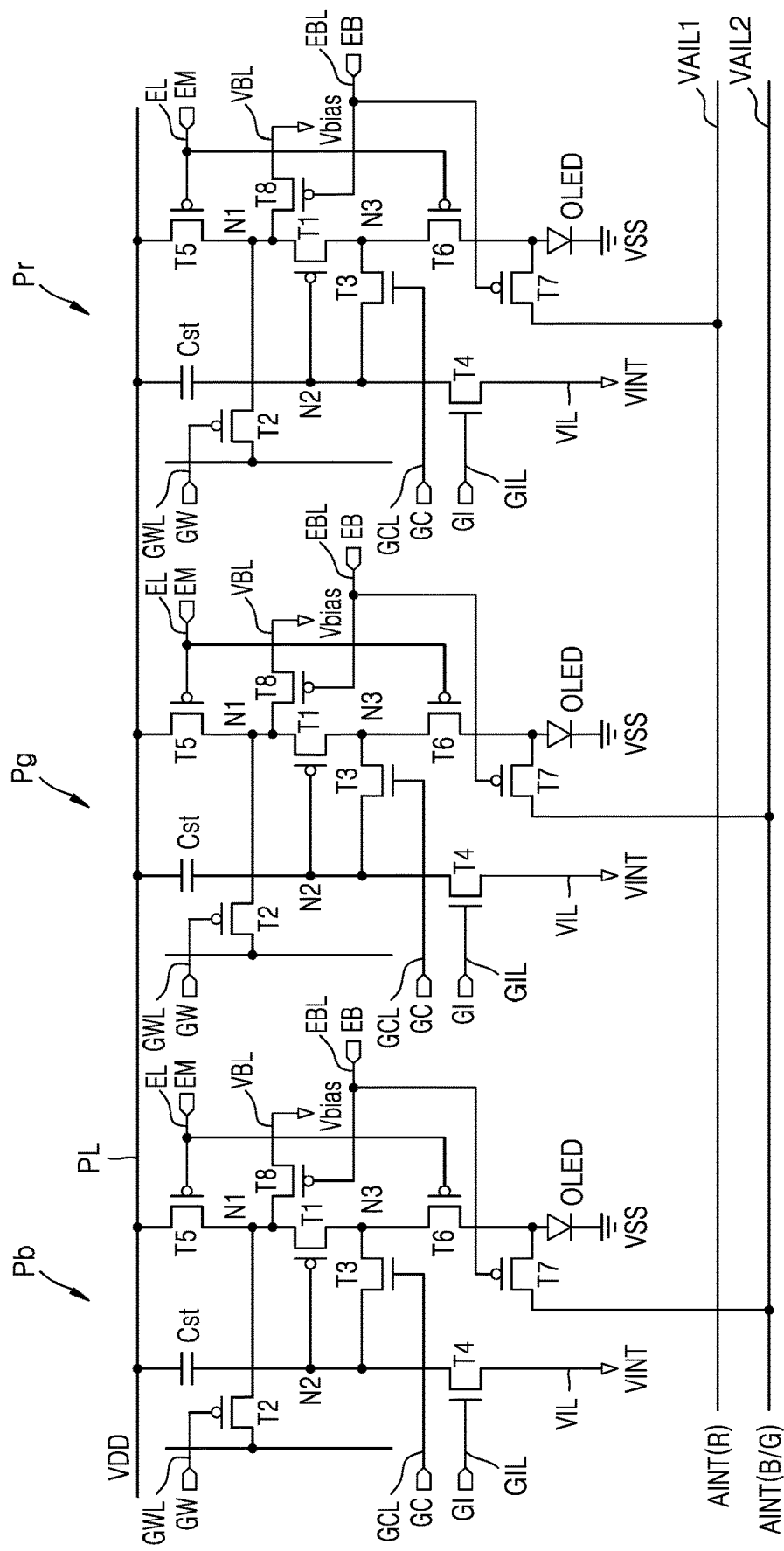
Figure 12:
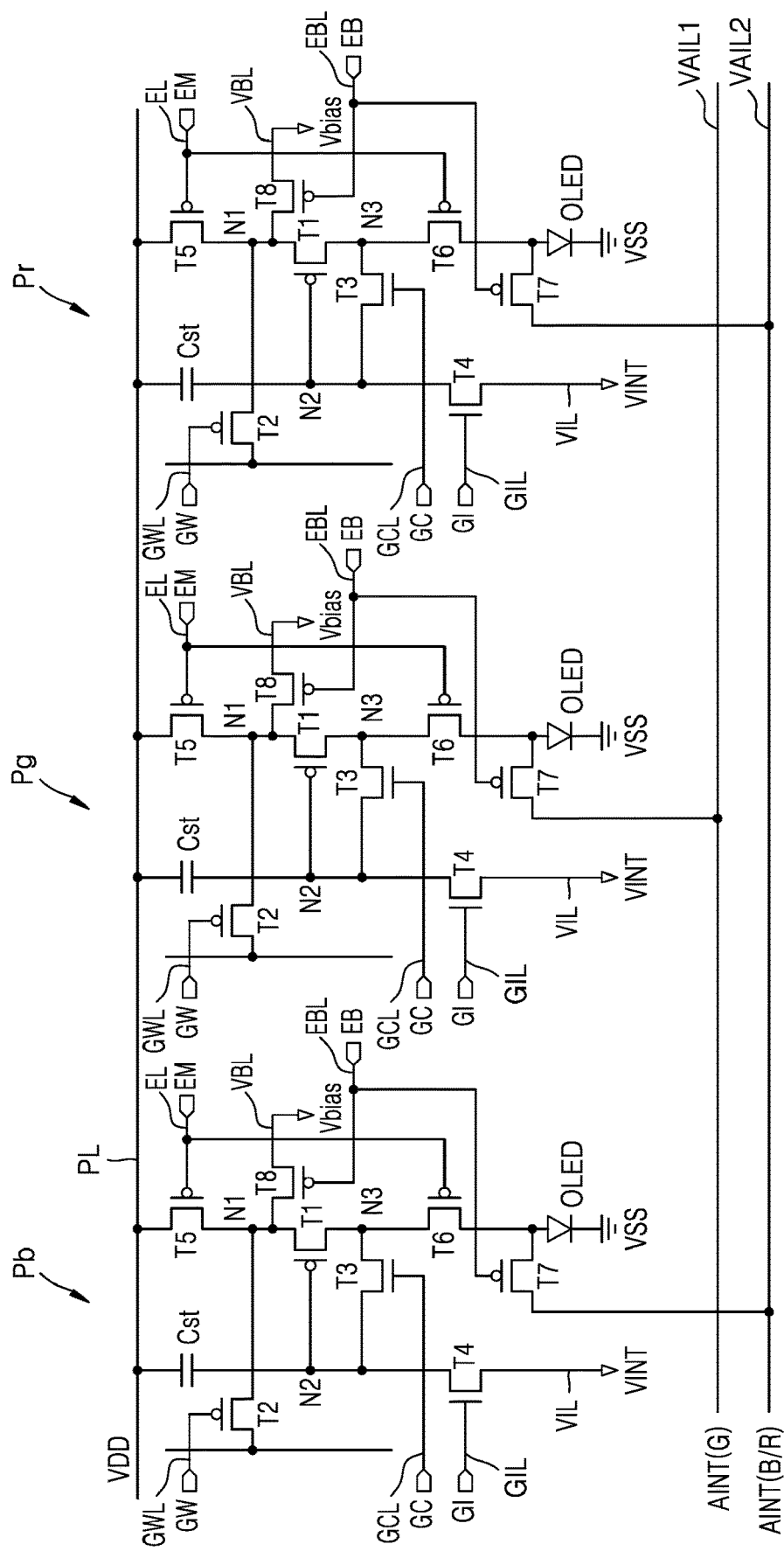

FIG. 9 is an enlarged plan view of a portion of a display panel according to an embodiment, and FIGS. 10 through 12 are circuit diagrams illustrating some pixels according to embodiments.

FIG. 9 illustrates only necessary wirings in the description. Thus, more wirings are omitted. Referring to FIG. 9, in the display area (DA, FIG. 1), the pixels P may be arranged in rows and columns, and the driving initialization voltage line VILa, the first initialization voltage line VAIL1, the second initialized voltage line VAIL2, and the common voltage line VSSL may be arranged along a boundary formed by adjacent pixels P.

The first initialization voltage line VAIL1 may transmit a first initialization voltage to one electrode of a first organic light-emitting diode that emits light of a first color. The first initialization voltage line VAIL1 may include a first vertical voltage line extending in the first direction (e.g., a y-direction) and a horizontal voltage line extending in the second direction (e.g., an x-direction). The first horizontal voltage line VL1b may include a protrusion VL1bp overlapping the first vertical voltage line VL1a, and the protrusion VL1bp may be connected to the first vertical voltage line VL1a through the contact hole.

The second initialization voltage line VAIL2 may transmit a second initialization voltage to one electrode of a second organic light-emitting diode that emits light of a second color and one electrode of a third organic light-emitting diode that emits light of a third color. The second initialization voltage line VAIL2 may include a second vertical voltage line VL2a extending in the first direction (e.g., a y-direction) and a second horizontal voltage line VL2b extending in the second direction (e.g., an x-direction). The second horizontal voltage line VL2b may include a protrusion VL2bp overlapping the second vertical voltage line VL2a, and the protrusion VL2bp may be connected to the second vertical voltage line VL2a through the contact hole.

The driving initialization voltage line VILa may extend in the first direction (e.g., a y-direction). The driving initialization voltage line VILa may be electrically connected to the horizontal driving initialization voltage line (see VILb of FIG. 5) shown in FIG. 5 through the contact hole and may transmit a driving initialization voltage to a source region of the fourth thin film transistor (see T4 of FIG. 5).

The common voltage line VLSS may extend in the first direction (e.g., a y-direction). The common voltage line VLSS may transmit a common voltage VSS applied to an opposite electrode (see 230 of FIG. 7) of each organic light-emitting diode. In an embodiment, the display panel (see 10 of FIG. 2) may further include a common voltage supply line (not shown) arranged in the peripheral area PA, and the common voltage line VLSS may be electrically connected to the common voltage supply line.

The driving initialization voltage line VILa, the first vertical voltage line VL1a, the second vertical voltage line VL2a, and the common voltage line VLSS may be arranged on the same layer, as described above. For example, the driving initialization voltage line VILa, the first vertical voltage line VL1a, the second vertical voltage line VL2a, and the common voltage line VLSS may be included in the fifth conductive layer.

The driving initialization voltage line VILa, the first vertical voltage line VL1a, the second vertical voltage line VL2a, and the common voltage line VLSS may be alternately arranged in the second direction (e.g., an x-direction) at certain intervals in the display area DA. For example, the driving initialization voltage line VILa, the first vertical voltage line VL1a, the second vertical voltage line VL2a, and the common voltage line VLSS may be alternately arranged with at least one pixel P therebetween.

The first horizontal voltage line VL1b and the second horizontal voltage line VL2b may be arranged on different layers. For example, the first horizontal voltage line VL1b may be arranged on one of the first conductive layer, the second conductive layer, and the third conductive layer, and the second horizontal voltage line VL2b may be arranged on another layer of the first conductive layer, the second conductive layer, and the third conductive layer. The first horizontal voltage line VL1b and the second horizontal voltage line VL2b may overlap each other in a plan view, and the pixels P arranged in the same row may share the first horizontal voltage line VL1b and the second horizontal voltage line VL2b.

In an embodiment of the present disclosure, one sub-pixel among the sub-pixels Pb, Pr, and Pg that constitute one pixel P may be electrically connected to the first initialization voltage line VAIL1 and may receive the same initialization voltage applied thereto, and another two sub-pixel may be electrically connected to the second initialization voltage line VAIL2 and may receive different initialization voltages applied thereto.

In an embodiment, as shown in FIG. 10, one electrode of the OLED of the first sub-pixel Pb that emits light of a blue color may be electrically connected to the first initialization voltage line VAIL1 and may receive a first initialization voltage AINT(B). One electrode of the OLED of the second sub-pixel Pr that emits light of a red color and one electrode of the OLED of the third sub-pixel Pg that emits light of a green color may be electrically connected to the second initialization voltage line VAIL2 and may receive a second initialization voltage AINT(R/G).

In another embodiment, as shown in FIG. 11, one electrode of the OLED of the second sub-pixel Pr may be electrically connected to the first initialization voltage line VAIL1 and may receive a first initialization voltage AINT(R), and one electrode of the OLED of the first sub-pixel Pb and one electrode of the OLED of the third sub-pixel Pg may be electrically connected to the second initialization voltage line VAIL2 and may receive a second initialization voltage AINT(B/G).

In another embodiment, as shown in FIG. 12, one electrode of the OLED of the third sub-pixel Pg may be electrically connected to the first initialization voltage line VAIL1 and may receive a first initialization voltage AINT(G), and one electrode of the OLED of the first sub-pixel Pb and one electrode of the OLED of the second sub-pixel Pr may be electrically connected to the second initialization voltage line VAIL2 and may receive a second initialization voltage AINT(R/B).

Figure 13:
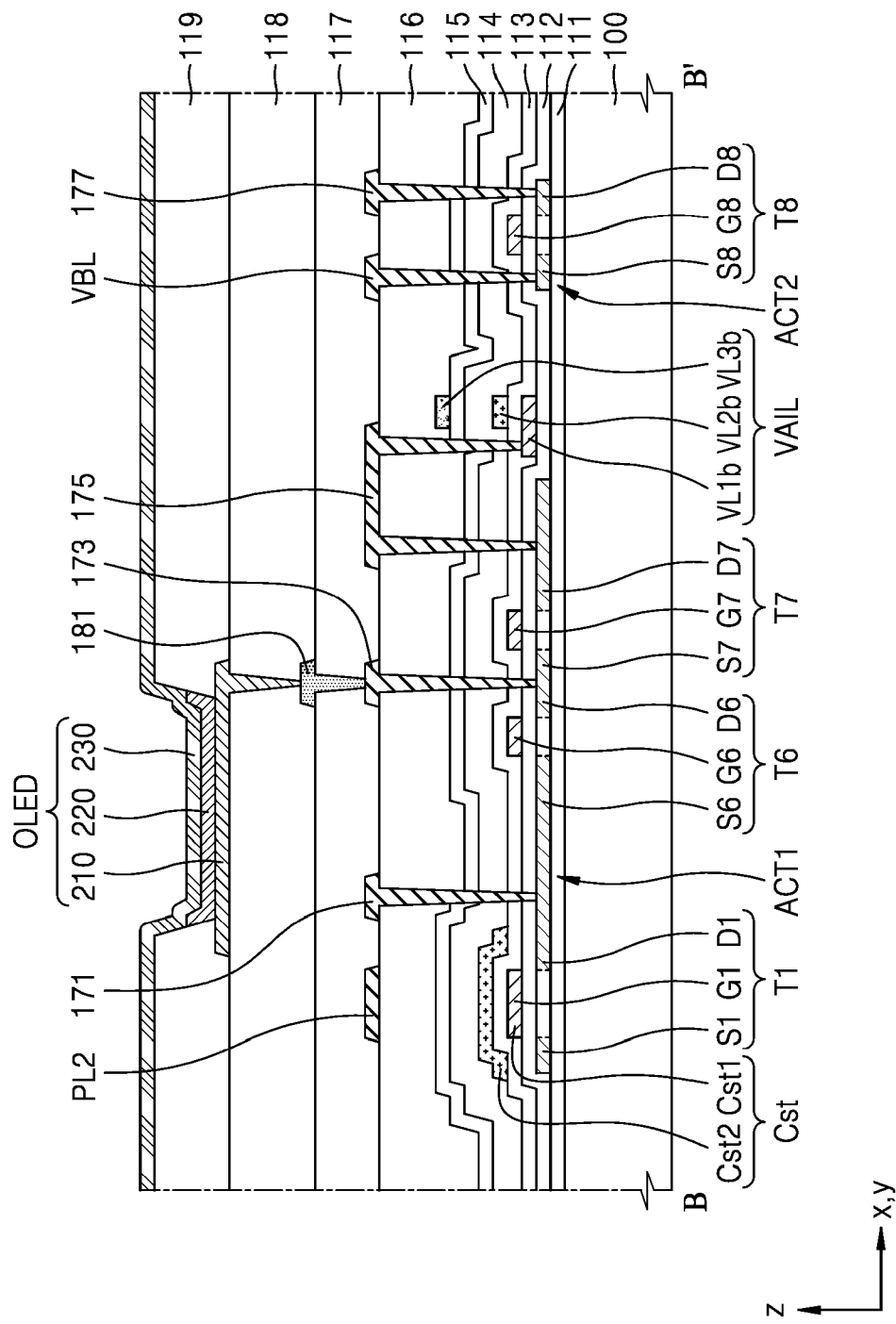
FIG. 13 is a cross-sectional view of a display panel according to an embodiment taken along the line B-B' of FIG. 5, according to an embodiment.
Figure 15:
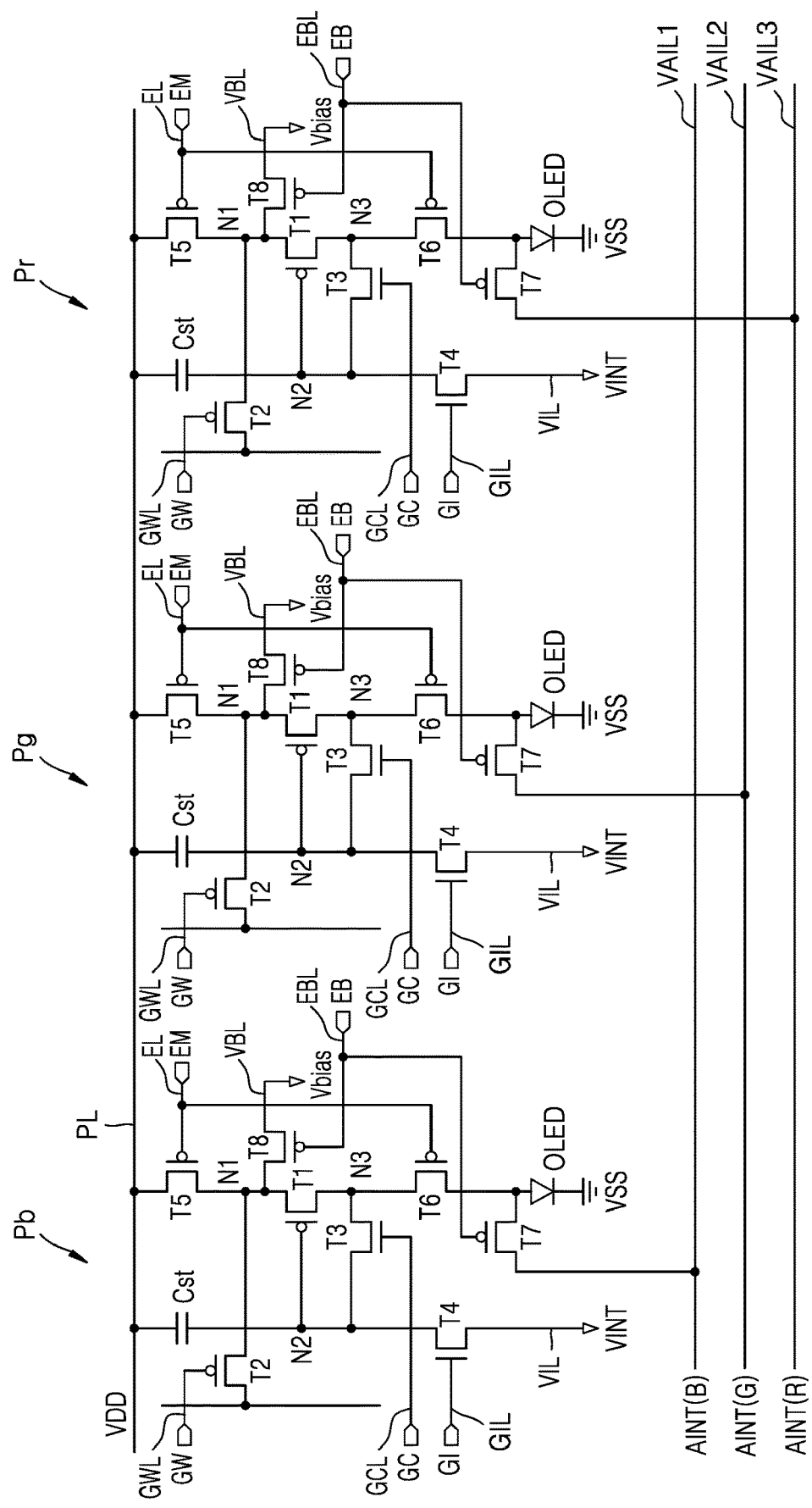
FIG. 15 is a circuit diagram illustrating one pixel according to an embodiment.

FIG. 13 is a cross-sectional view of a display panel according to an embodiment taken along a line B-B' of FIG. 5 according to an embodiment, FIG. 14 is an enlarged plan view of a portion of a display panel according to an embodiment, and FIG. 15 is a circuit diagram illustrating some pixels according to an embodiment.

FIG. 13 is similar to FIG. 7 but is different from FIG. 7 in that the initialization voltage line VAIL includes a first initialization voltage line VAIL1, a second initialization voltage line VAIL2, and a third initialization voltage line VAIL3. Hereinafter, descriptions of the same components will be omitted, and descriptions will be provided based on the initialization voltage line VAIL. Also, for convenience of explanation, the first initialization voltage line VAIL1 is electrically connected to the first sub-pixel Pb, the second initialization voltage line VAIL2 is electrically connected to the second sub-pixel Pr, and the third initialization voltage line VAIL3 is electrically connected to the third sub-pixel Pg. However, embodiments are not limited thereto.

The first initialization voltage line VAIL1 may transmit a first initialization voltage to one electrode of an organic light-emitting diode (OLED) that emits light of a first color. For example, the first initialization voltage line VAIL1 may transmit the first initialization voltage AINT(B) to one electrode of the OLED of the first sub-pixel Pb that emits light of a blue color. The first initialization voltage line VAIL1 may include a first vertical voltage line VL1a and a first horizontal voltage line VL1b. The first horizontal voltage line VL1b may include a protrusion VL1bp overlapping the first vertical voltage line VL1a, and the protrusion VL1bp may be connected to the first vertical voltage line VL1a through the contact hole.

The second initialization voltage line VAIL2 may transmit a second initialization voltage to one electrode of an organic light-emitting diode (OLED) that emits light of a second color. For example, the second initialization voltage line VAIL2 may transmit the second initialization voltage AINT(R) to one electrode of the organic light-emitting diode (OLED) of the second sub-pixel Pr that emits light of a red color. The second initialization voltage line VAIL2 may include a second vertical voltage line VL2a and a second horizontal voltage line VL2b. The second horizontal voltage line VL2b may include a protrusion VL2bp overlapping the second vertical voltage line VL2a, and the protrusion VL2bp may be connected to the second vertical voltage line VL2a through the contact hole.

The third initialization voltage line VAIL3 may transmit a third initialization voltage to one electrode of the OLED that emits light of a third color. For example, the third initialization voltage line VAIL3 may transmit the first initialization voltage AINT(G) to one electrode of the OLED of the third sub-pixel Pg that emits light of a green color. The third initialization voltage line VAIL3 may include a third vertical voltage line VL3a and a third horizontal voltage line VL3b. The third horizontal voltage line VL3b may include a protrusion VL3bp overlapping the third vertical voltage line VL3a, and the protrusion VL3bp may be connected to the third vertical voltage line VL3a through the contact hole.

The first horizontal voltage line VL1b, the second horizontal voltage line VL2b, and the third horizontal voltage line VL3b may overlap one another in a plan view and may be arranged on different layers. In an embodiment, the first horizontal voltage line VL1b may be arranged on the first gate insulating layer 112, the second horizontal voltage line VL2b may be arranged on the second gate insulating layer 113, and the third horizontal voltage line VL3b may be arranged on the third gate insulating layer 115. For example, the first horizontal voltage line VL1b may be arranged on the same layer as the first conductive layer including the gate electrode G1 of the first thin film transistor T1. The second horizontal voltage line VL2b may be arranged on the same layer as the second conductive layer including the upper electrode Cst2 of the capacitor Cst, the lower gate electrode (see G3 of FIG. 5) of the third thin film transistor (see T3 of FIG. 5), and the lower gate electrode (see G4a of FIG. 5) of the fourth thin film transistor (see T4 of FIG. 5). The third horizontal voltage line VL3b may be arranged on the same layer as the third conductive layer including the upper gate electrode (see G3b of FIG. 5) of the third thin film transistor (see T3 of FIG. 5) and the upper gate electrode (see G4b of FIG. 5) of the fourth thin film transistor (see T4 of FIG. 5).

In one embodiment, as a difference between initialization voltages transmitted by each horizontal voltage line increases, each horizontal voltage line may be farther arranged in the third direction (e.g., a z-direction). For example, when a first initialization voltage is applied to the first horizontal voltage line VL1b, a second initialization voltage may be applied to the second horizontal voltage line VL2b, a third initialization voltage is applied to the third horizontal voltage line VL3b and the size of each initialization voltage is the first initialization voltage<the second initialization voltage<the third initialization voltage, each horizontal voltage line may be arranged so that a distance between two horizontal voltage lines VL1b and VL3b is maximum. That is, the first horizontal voltage line VL1b may be arranged on the first conductive layer, the third horizontal voltage line VL3b may be arranged on the third conductive layer, or the first horizontal voltage line VL1b may be arranged on the third conductive layer, and the third horizontal voltage line VL3b may be arranged on the first conductive layer.

The driving initialization voltage line VILa, the first vertical voltage line VL1a, the second vertical voltage line VL2a, the third vertical voltage line VL3a, and the common voltage line VLSS may be arranged on the same layer, as described above. For example, the driving initialization voltage line VILa, the first vertical voltage line VL1a, the second vertical voltage line VL2a, the third vertical voltage line VL3a, and the common voltage line VLSS may be included in the fifth conductive layer.

The driving initialization voltage line VILa, the first vertical voltage line VL1a, the second vertical voltage line VL2a, the third vertical voltage line VL3a, and the common voltage line VLSS may be alternately arranged in the second direction (e.g., an x-direction) at certain intervals in the display area (see DA of FIG. 1). For example, the driving initialization voltage line VILa, the first vertical voltage line VL1a, the second vertical voltage line VL2a, the third vertical voltage line VL3a, and the common voltage line VLSS may be alternately arranged with one column constituted by the pixels P.

Figure 16:
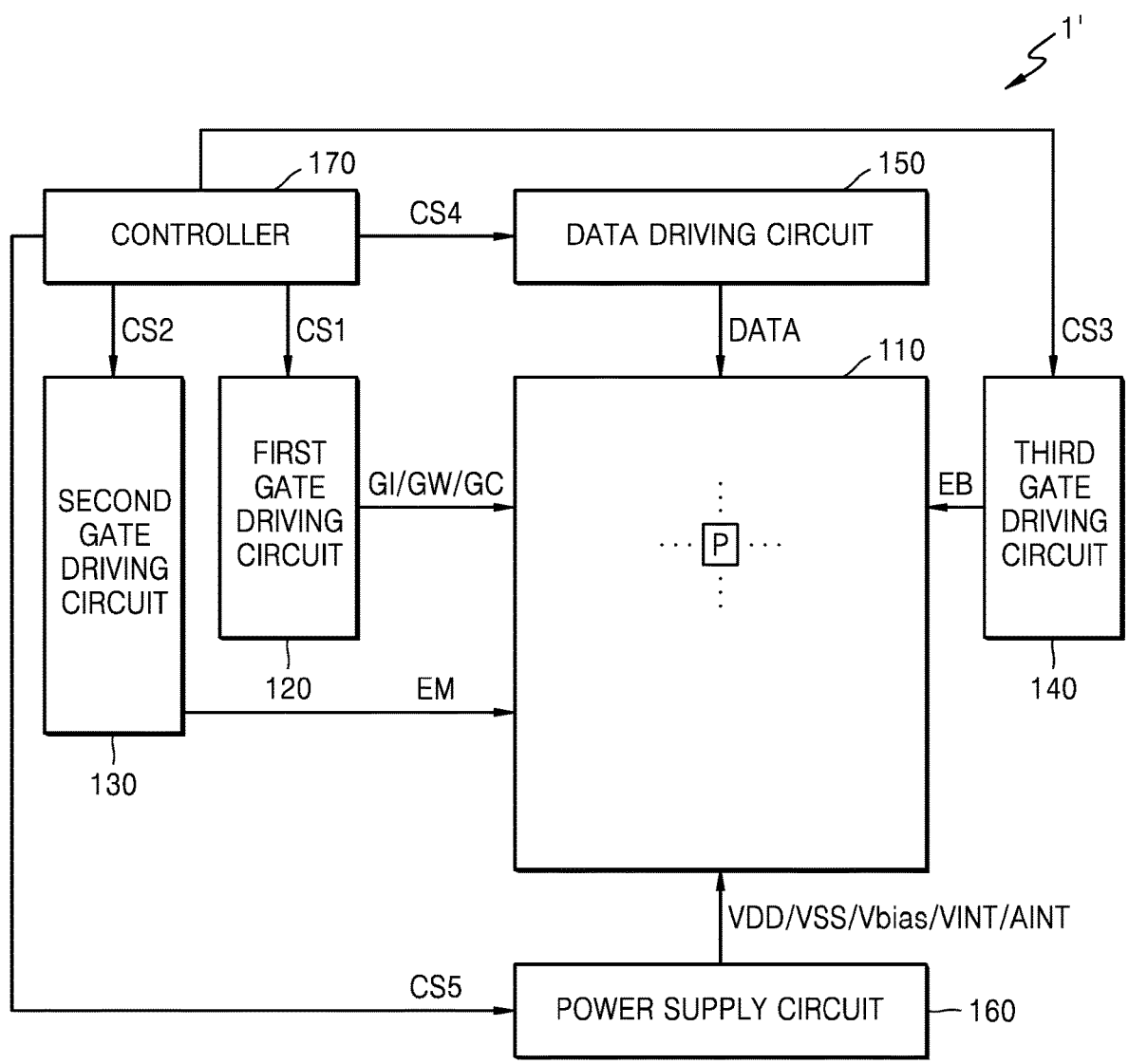
FIG. 16 is a view schematically illustrating a display apparatus according to an embodiment.

FIG. 16 is a view schematically illustrating a display apparatus according to an embodiment.

A display apparatus 1' according to an embodiment may include a pixel portion 110, a first gate driving circuit 120, a second gate driving circuit 130, a third gate driving circuit 140, a data driving circuit 150, a power supply circuit 160, and a controller 170.

A plurality of pixels P may be arranged in the pixel portion 110. The plurality of pixels P may be arranged in various forms, such as a stripe arrangement, a pentile arrangement, a mosaic arrangement, and the like, thereby realizing an image. The pixel portion 110 may correspond to the display area DA of the substrate 100 shown in FIG. 2. Each pixel P may include an organic light-emitting diode (OLED) as a display element, and the organic light-emitting diode (OLED) may be connected to a pixel circuit PC. Each pixel P may emit light of a red, green, blue or white color, for example, through the OLED.

In the pixel portion 110, a plurality of first through third scan lines, a plurality of light-emitting control lines, and a plurality of bias control lines may be spaced apart from one another at certain intervals and may be arranged in a row. The plurality of first scan lines may transmit a first scan signal GW to each corresponding pixel P. The plurality of second scan lines may transmit a second scan signal GI to each corresponding pixel P. The plurality of third scan lines may transmit a third scan signal GC to each corresponding pixel P. The plurality of light-emitting control lines may transmit an emission control signal EM to each corresponding pixel P. The plurality of bias control lines may transmit a bias control signal EB to each corresponding pixel P. In the pixel portion 110, a plurality of data lines may be arranged at certain intervals in a column, and a data signal DATA may be transmitted to each corresponding pixel P.

A first gate driving circuit 120 may be connected to a plurality of first through third scan lines of the pixel portion 110 and may apply first through third scan signals GW, GI, and GC to first through third scan lines in response to a first control signal CS1. When the first through third scan signals GW, GI and GC have ON voltages, a transistor of the pixel P connected to a corresponding scan line may be turned on.

A second gate driving circuit 130 may be connected to a plurality of light-emitting control lines of the pixel portion 110 and may apply the light-emitting control signal EM to light-emitting control lines in response to the second control signal CS2.

A third gate driving circuit 140 may be connected to a plurality of bias control lines of the pixel portion 110 and may apply the bias control signal EB to bias control lines in response to the third control signal CS3. A third gate driving circuit 140 may apply different bias control signals EB to pixels that emit light of different colors. The on-voltage applying time of the bias control signal EB per pixel may be set to a value for minimizing a brightness deviation (a current deviation) per pixel according to a material for forming a display panel (e.g., a material for a transistor and an organic light-emitting diode).

A data driving circuit 150 may be connected to a plurality of data lines of the pixel portion 110 and may apply a data signal DATA indicating gray scale in response to a fourth control signal CS4 to data lines. The data driving circuit 150 may convert input image data having a gray scale inputted from the controller 170 into a data signal having a voltage or current form.

The power supply circuit 160 may generate a driving voltage VDD, a common voltage VSS, a bias voltage Vbias, a driving initialization voltage VINT or an initialization voltage AINT. The power supply circuit 160 may apply the driving voltage VDD generated in response to a fifth control signal CS5, a common voltage VSS, a bias voltage Vbias, a driving initialization voltage VINT or an initialization voltage AINT to the pixels P of the pixel portion 110. The power supply circuit 160 may apply different bias voltages Vbias or different initialization voltages AINT to pixels that emit light of different colors. The size of the bias voltage Vbias and the initialization voltage AINT per pixel may be set to a value for minimizing a brightness deviation (a current deviation) per pixel according to a material for forming a display panel (e.g., a material for a transistor and an organic light-emitting diode).

In an embodiment, the power supply circuit 160 may apply a first initialization voltage to one electrode of a first OLED that emits light of a first color and may apply a second initialization voltage to one electrode of a second OLED that emits light of a second color different from the first color.

In another embodiment, the power supply circuit 160 may apply a first initialization voltage to one electrode of a first OLED that emits light of a first color and may apply a second initialization voltage to one electrode of a second OLED that emits light of a second color and to one electrode of a third OED that emits light of a third color.

In another embodiment, the power supply circuit 160 may apply the first initialization voltage to one electrode of the first OLED that emits light of a first color and may apply the second initialization voltage to one electrode of the second OLED that emits light of a second color and to one electrode of the third OED that emits light of a third color.

The controller 170 may receive input image data and an input control signal for controlling display of the input image data from an external graphic controller (not shown). The input control signal may include, for example, a vertical synchronous signal Vsync, a horizontal synchronous signal Hsync, and a main clock signal MCLK. The controller 170 may generate first through fifth control signals CS1, CS2, CS3, CS4, and CS5 in response to the vertical synchronous signal Vsync, the horizontal synchronous signal Hsync and the main clock signal MCLK to transmit the first through fifth control signals CS1, CS2, CS3, CS4, and CS5 to the first gate driving circuit 120, the second gate driving circuit 130, the third gate driving circuit 140, the data driving circuit 150, and the power supply circuit 160, respectively.

The first gate driving circuit 120, the second gate driving circuit 130, and the third gate driving circuit 140 may be one implementation example of the scan driver 1100 shown in FIG. 2. The data driving circuit 150 may be one implementation example of the data driver 1200 shown in FIG. 2. Each of the first gate driving circuit 120, the second gate driving circuit 130, the third gate driving circuit 140, the data driving circuit 150, the power supply circuit 160, and the controller 170 may be formed in the form of a separate integrated circuit (IC) chip or one IC chip and may be mounted directly on a substrate on which the pixel portion 110 is formed, or may be mounted on a flexible printed circuit film or may be attached to the substrate in the form of a tape carrier package (TCP) or may be formed directly on the substrate.

According to an embodiment described above, a display panel in which electrical characteristics of an OLED per (sub-)pixel that emits light of different colors are compensated for so that image quality characteristics can be enhanced, and a display apparatus including the display panel can be implemented. Of course, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the following claims.

What is claimed is:

1. A display panel comprising:
a substrate comprising a display area in which a plurality of pixels are arranged, and a peripheral area surrounding at least a portion of the display area;
an initialization voltage line in the display area, the initialization voltage line comprising a first voltage line extending in a first direction and a second voltage line extending in a second direction intersecting the first direction;
a driving initialization voltage line in the display area, the driving initialization voltage line comprising a first driving initialization voltage line extending in the first direction and a second driving initialization voltage line extending in the second direction; and
a pixel circuit layer between the substrate and light-emitting diodes of the plurality of pixels, the pixel circuit layer comprising a plurality of transistors and capacitors,
wherein the initialization voltage line is configured to transmit an initialization voltage to a sub-pixel of the plurality of pixels,
the driving initialization voltage line is configured to transmit a driving initialization voltage to a gate electrode of a driving transistor of the sub-pixel,
the first voltage line and the first driving initialization voltage line are on different layers,
the pixel circuit layer further comprises:
a first semiconductor layer on the substrate;
a first conductive layer on the first semiconductor layer;
a second conductive layer on the first conductive layer;
a second semiconductor layer on the second conductive layer;
a third conductive layer on the second semiconductor layer; and
a fourth conductive layer on the third conductive layer,
the first voltage line and one layer of the first conductive layer, the second conductive layer, and the third conductive layer are on a same layer, and
the first driving initialization voltage line and the fourth conductive layer are on a same layer.

2. A display panel comprising:
a substrate comprising a display area in which a plurality of pixels are arranged, and a peripheral area surrounding at least a portion of the display area;
an initialization voltage line in the display area, the initialization voltage line comprising a first voltage line extending in a first direction and a second voltage line extending in a second direction intersecting the first direction; and a driving initialization voltage line in the display area, the driving initialization voltage line comprising a first driving initialization voltage line extending in the first direction and a second driving initialization voltage line extending in the second direction;

wherein the initialization voltage line is configured to transmit an initialization voltage to a sub-pixel of the plurality of pixels, the driving initialization voltage line is configured to transmit a driving initialization voltage to a gate electrode of a driving transistor of the sub-pixel, the first voltage line and the first driving initialization voltage line are on different layers, and the second voltage line and the second driving initialization voltage line are spaced apart from each other with at least one pixel therebetween.

3. A display panel comprising:

a substrate comprising a display area, in which a plurality of pixels are arranged, and a peripheral area surrounding at least a portion of the display area;

a first initialization voltage line in the display area, the first initialization voltage line comprising a first voltage line extending in a first direction and a third voltage line extending in a second direction intersecting the first direction; and a second initialization voltage line in the display area, the second initialization voltage line comprising a second voltage line, overlapping the first voltage line in a plan view, and a fourth voltage line extending in the second direction; and a driving initialization voltage line in the display area, the driving initialization voltage line comprising a first driving initialization voltage line extending in the first direction and a second driving initialization voltage line extending in the second direction;

wherein each of the plurality of pixels comprises a first sub-pixel configured to emit light of a first color and a second sub-pixel configured to emit light of a second color, the first initialization voltage line is configured to transmit a first initialization voltage to the first sub-pixel, the second initialization voltage line is configured to transmit a second initialization voltage to the second sub-pixel, and the first voltage line and the second voltage line are on different layers from the first driving initialization voltage line.

4. The display panel of claim 3, further comprising a pixel circuit layer between the substrate and light-emitting diodes of the plurality of pixels, the pixel circuit layer comprising a plurality of transistors and capacitors, wherein the pixel circuit layer further comprises:

a first semiconductor layer on the substrate;

a first conductive layer on the first semiconductor layer;

a second conductive layer on the first conductive layer;

a second semiconductor layer on the second conductive layer;

a third conductive layer on the second semiconductor layer; and a fourth conductive layer on the third conductive layer; wherein the first voltage line and one of the first conductive layer, the second conductive layer, and the third conductive layer are on a same layer, the second voltage line and one of the first conductive layer, the second conductive layer, and the third conductive layer are on another layer, the first driving initialization voltage line and the fourth conductive layer are on a same layer.

5. The display panel of claim 4, wherein the first voltage line and the second conductive layer are on a same layer, and the second voltage line and the third conductive layer are on a same layer.

* * * * *